(12) United States Patent
Kamada et al.

(10) Patent No.: US 9,310,447 B2
(45) Date of Patent: Apr. 12, 2016

(54) MAGNETIC FIELD MEASURING APPARATUS AND METHOD FOR MANUFACTURING SAME

(75) Inventors: Yudai Kamada, Tokyo (JP); Taro Osabe, Tokyo (JP); Seiichi Suzuki, Tokyo (JP); Akihiko Kandori, Tokyo (JP); Ryuzo Kawabata, Tokyo (JP)

(73) Assignee: HITACHI, LTD., Tokyo (JP)

(*) Notice: Subject to any disclaimer, the term of this patent is extended or adjusted under 35 U.S.C. 154(b) by 137 days.

(21) Appl. No.: 14/358,810

(22) PCT Filed: Nov. 18, 2011

(86) PCT No.: PCT/JP2011/006417
§ 371 (c)(1),
(2), (4) Date: May 29, 2014

(87) PCT Pub. No.: WO2013/072967
PCT Pub. Date: May 23, 2013

(65) Prior Publication Data
US 2014/0306700 A1     Oct. 16, 2014

(51) Int. Cl.
*G01R 3/00* (2006.01)
*G01R 33/032* (2006.01)
*G01R 33/26* (2006.01)

(52) U.S. Cl.
CPC ............. *G01R 33/0322* (2013.01); *G01R 3/00* (2013.01); *G01R 33/26* (2013.01); *Y10T 29/49002* (2015.01)

(58) Field of Classification Search
None
See application file for complete search history.

(56) References Cited

U.S. PATENT DOCUMENTS

| | | | | | |
|---|---|---|---|---|---|
| 5,677,076 | A * | 10/1997 | Sato | ............... | H01M 2/1241 429/164 |
| 6,570,459 | B1 * | 5/2003 | Nathanson | ............... | G04F 5/14 331/94.1 |
| 7,292,031 | B2 * | 11/2007 | Abbink | ............... | G01C 19/60 324/304 |
| 7,292,111 | B2 * | 11/2007 | Abbink | ............... | G04F 5/14 331/3 |
| 7,359,059 | B2 * | 4/2008 | Lust | ............... | G01C 19/62 356/459 |
| 7,826,065 | B1 * | 11/2010 | Okandan | ............... | G01B 11/02 324/244.1 |
| 7,872,473 | B2 * | 1/2011 | Kitching | ............... | G01C 19/60 324/300 |
| 7,893,780 | B2 * | 2/2011 | Bulatowicz | ............... | G04F 5/14 331/3 |

(Continued)

FOREIGN PATENT DOCUMENTS

| | | |
|---|---|---|
| JP | 04-242040 A | 8/1992 |
| JP | 2009-232335 A | 10/2009 |
| JP | 2011-232277 A | 11/2011 |

OTHER PUBLICATIONS

Griffith et al., "Femtotesla atomic magnetometry in a microfabricated vapor cell", Optics Express, Dec. 9, 2010, vol. 18, No. 26, pp. 27167-27172.

*Primary Examiner* — Jermele M Hollington
*Assistant Examiner* — Suresh K Rajaputra
(74) *Attorney, Agent, or Firm* — Mattingly & Malur, P.C.

(57) ABSTRACT

In order to provide a magnetic field measuring apparatus facilitating the pressure control in a gas cell, or capable of inspecting the internal pressure of the gas cell without using any special process, the magnetic field measuring apparatus is configured such that a process layer of the magnetic field measuring apparatus has such a structure that includes a first hollow portion and a second hollow portion provided opposed to first hollow portion with a first isolation wall interposed therebetween. Alternatively, a method for manufacturing the magnetic field measuring apparatus includes breaking the first isolation wall after generating alkali metal (FIG. 17 and FIG. 20).

15 Claims, 24 Drawing Sheets

(56) References Cited

U.S. PATENT DOCUMENTS

| | | | | |
|---|---|---|---|---|
| 7,936,169 B2* | 5/2011 | Kanegsberg | G01C 19/62 | 324/300 |
| 8,212,556 B1* | 7/2012 | Schwindt | G01R 33/26 | 324/301 |
| 8,305,078 B2* | 11/2012 | Savukov | G01R 33/26 | 324/307 |
| 8,319,973 B2* | 11/2012 | Yang | G01C 19/66 | 356/469 |
| 8,964,293 B2* | 2/2015 | Nagasaka | G01R 33/032 | 250/428 |
| 2006/0132130 A1 | 6/2006 | Abbink et al. | | |
| 2007/0120563 A1* | 5/2007 | Kawabata | G01R 33/0354 | 324/244.1 |
| 2007/0167723 A1* | 7/2007 | Park | B82Y 30/00 | 600/409 |
| 2008/0000606 A1* | 1/2008 | Abbink | G04F 5/14 | 164/47 |
| 2008/0106261 A1* | 5/2008 | Romalis | G01R 33/441 | 324/304 |
| 2008/0128602 A1* | 6/2008 | Hattori | G01R 33/282 | 250/251 |
| 2010/0225313 A1* | 9/2010 | Blanz | G01R 33/26 | 324/303 |
| 2011/0025323 A1* | 2/2011 | Budker | G01R 33/26 | 324/304 |
| 2011/0031969 A1* | 2/2011 | Kitching | G01R 33/0286 | 324/304 |
| 2011/0095755 A1* | 4/2011 | Maki | G01R 33/032 | 324/244.1 |
| 2011/0101974 A1* | 5/2011 | Nagasaka | G01R 33/0322 | 324/244.1 |
| 2012/0206135 A1* | 8/2012 | Nagasaka | G01R 33/26 | 324/244.1 |
| 2012/0321433 A1* | 12/2012 | Toyoda | H01J 49/0459 | 414/804 |
| 2013/0047417 A1* | 2/2013 | Nagasaka | G01R 33/0076 | 29/592.1 |
| 2013/0341745 A1* | 12/2013 | Suzuki | G01R 33/032 | 257/427 |

\* cited by examiner

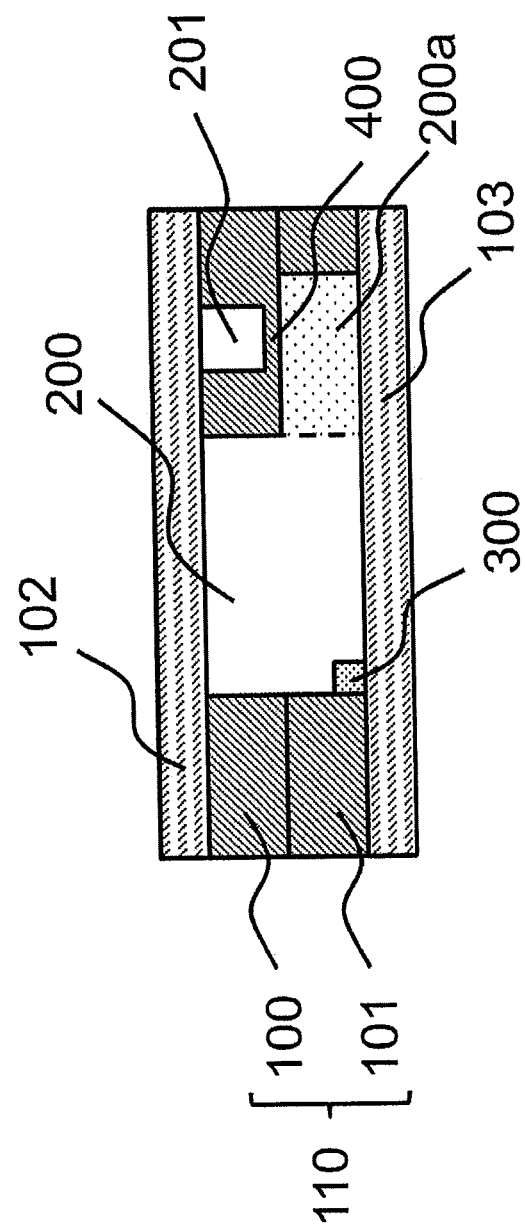

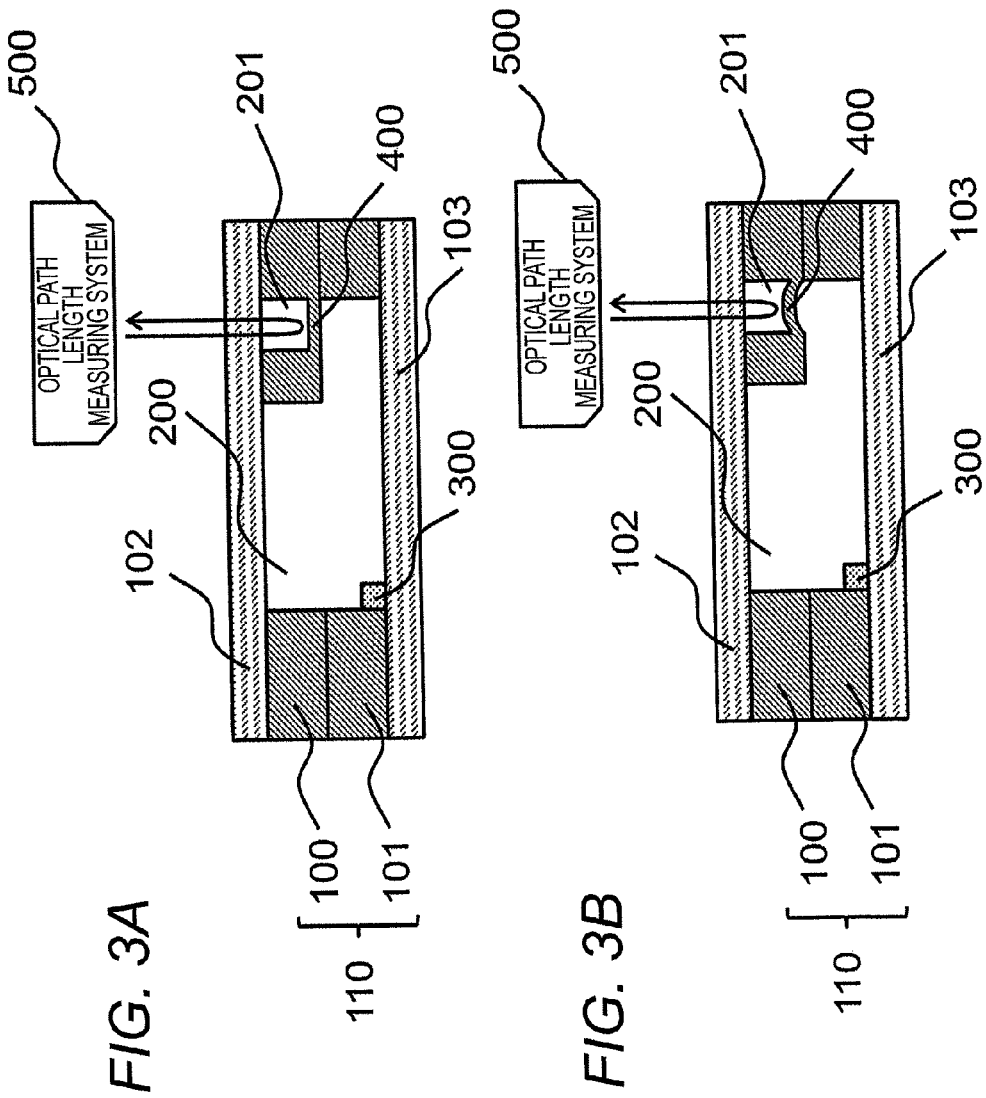

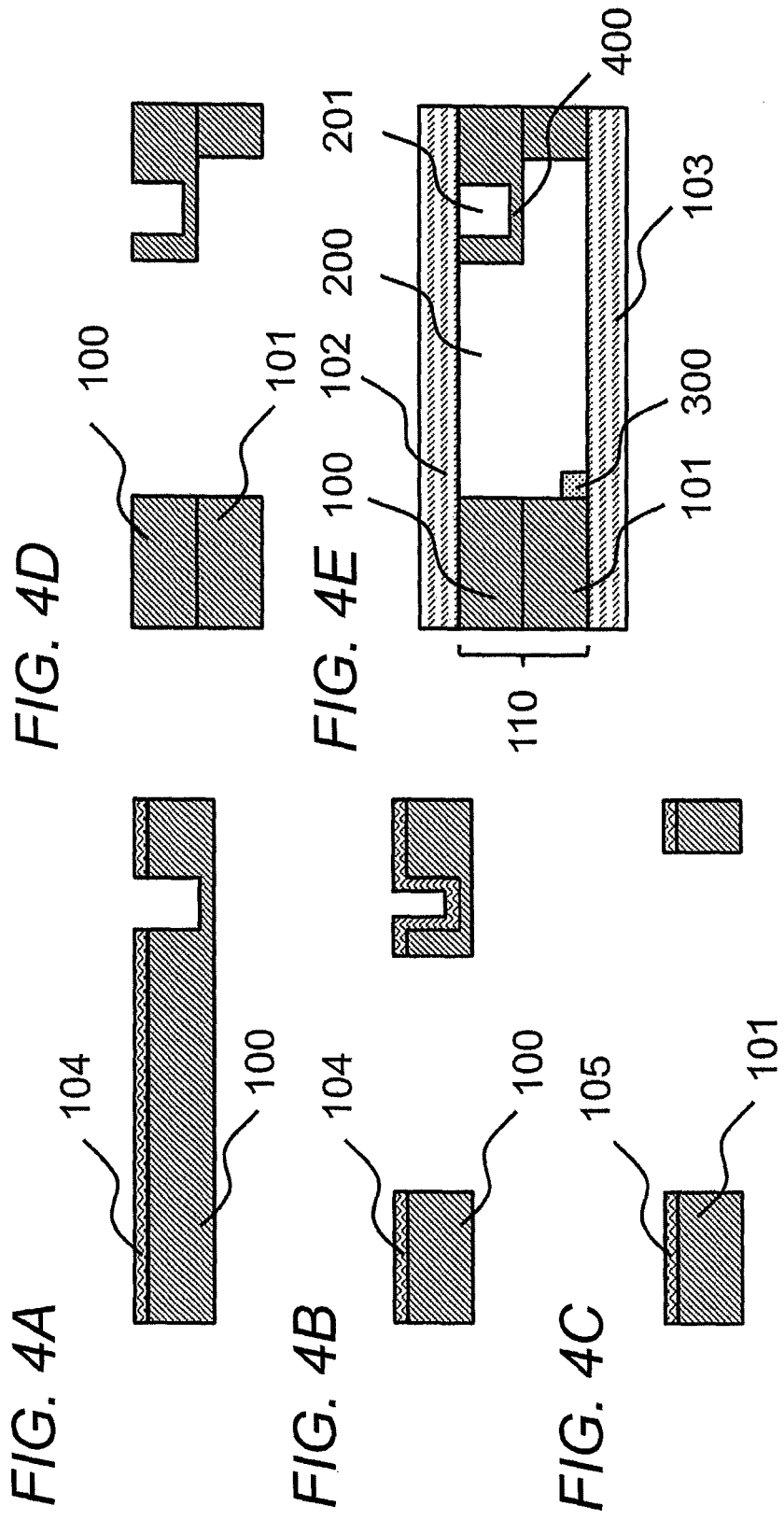

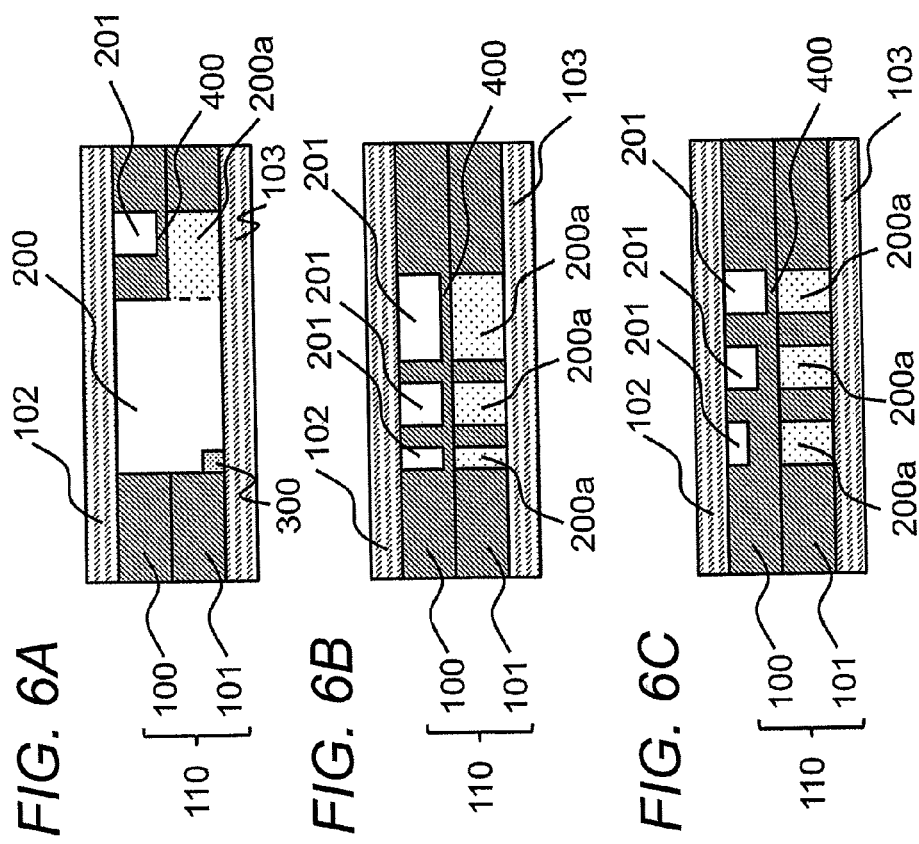

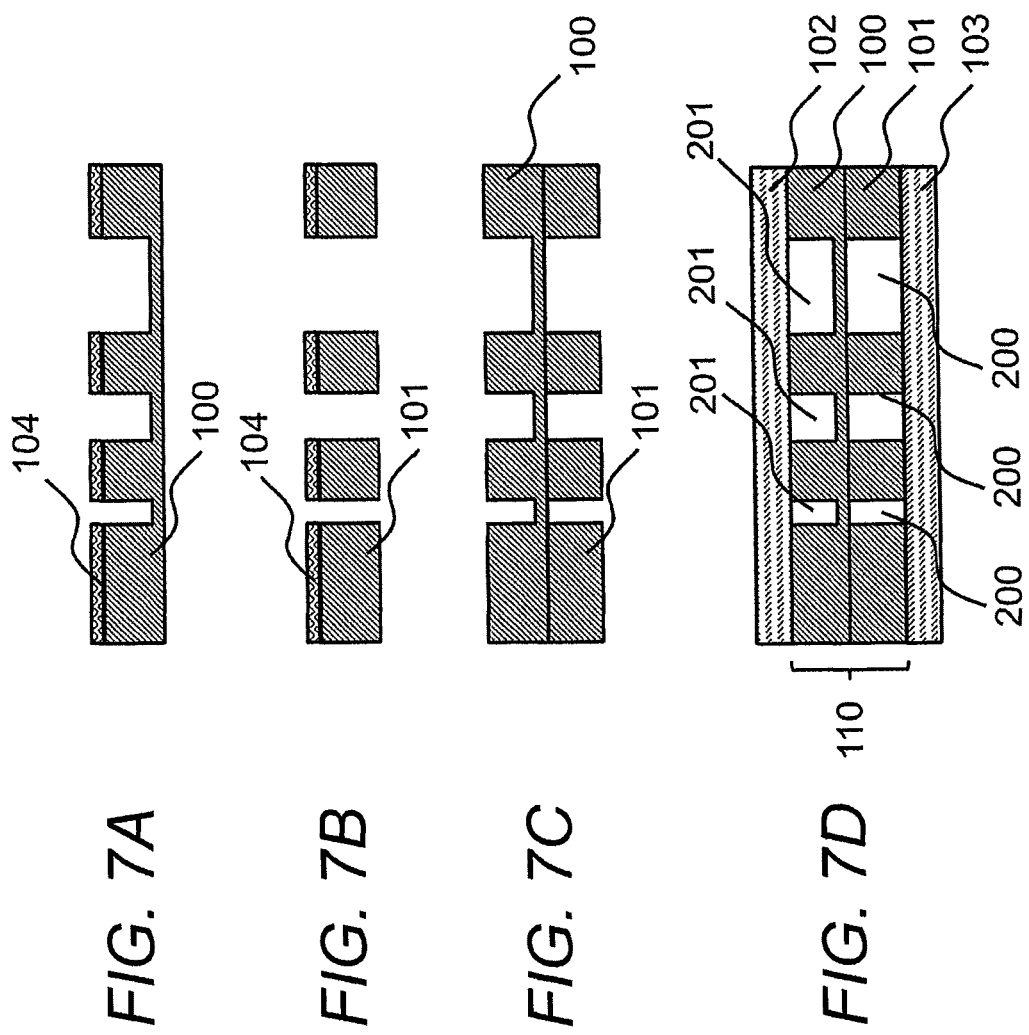

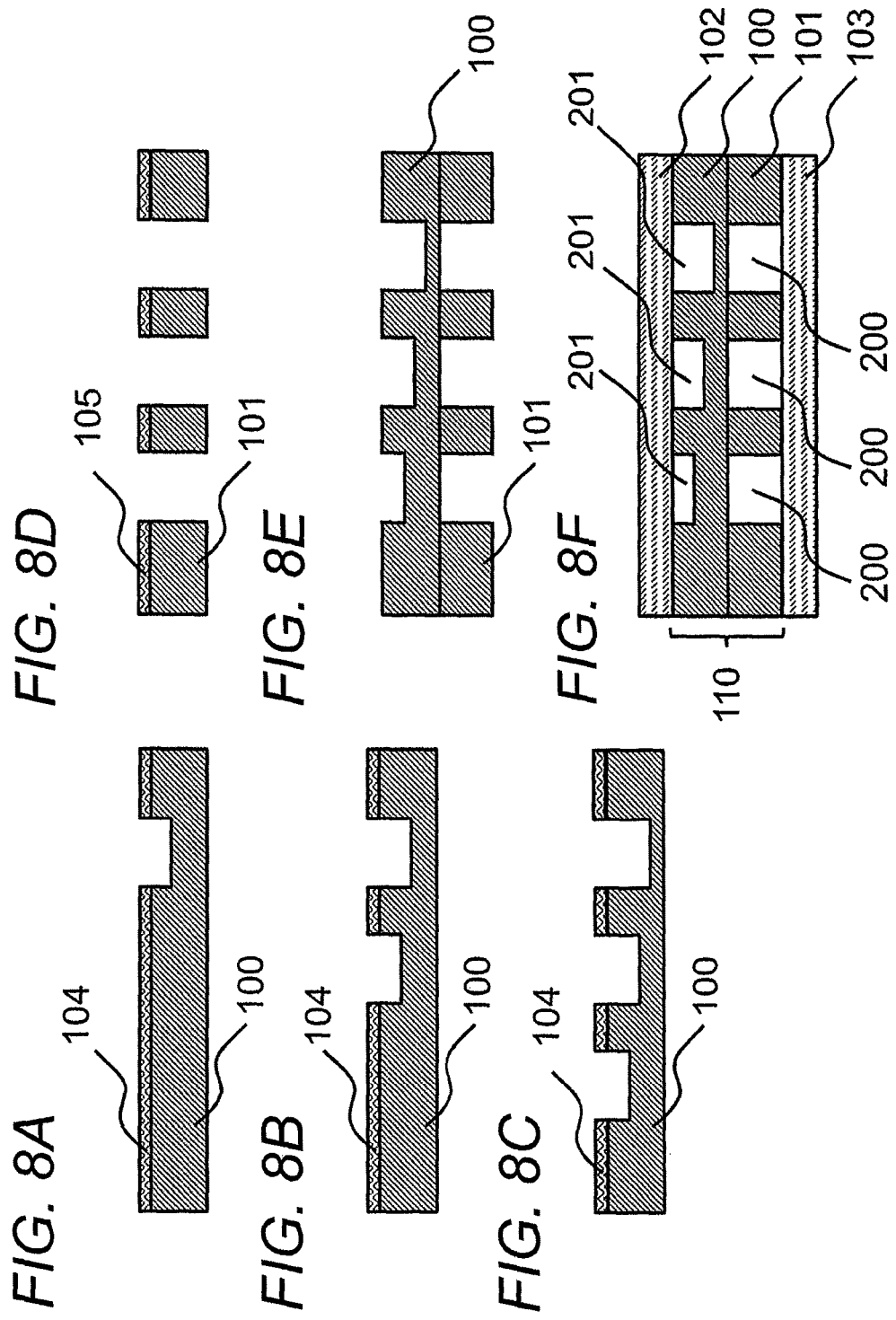

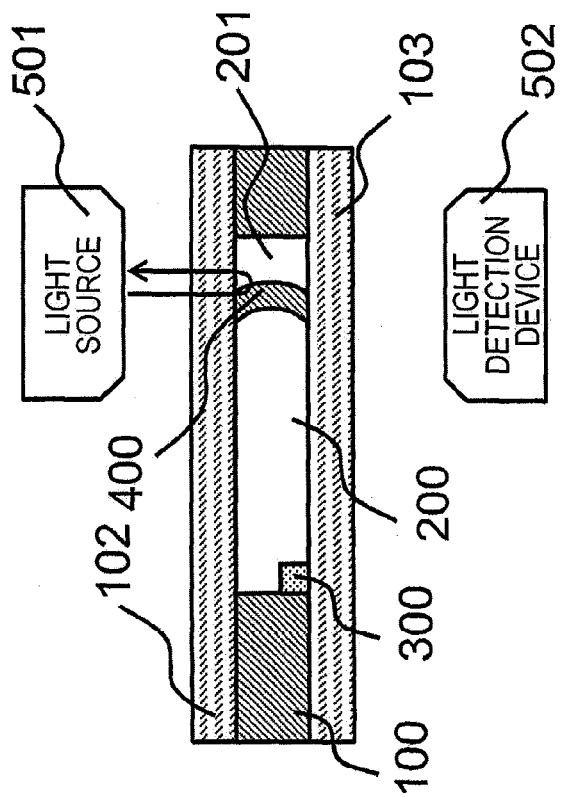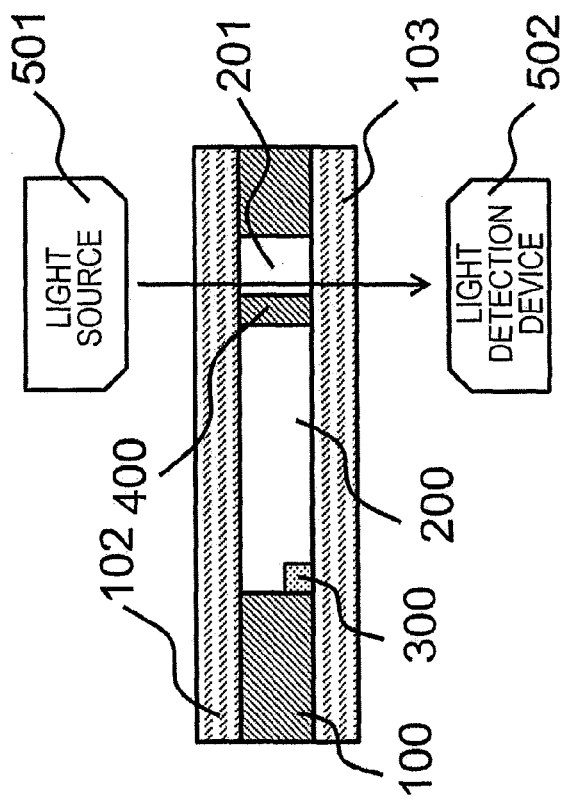

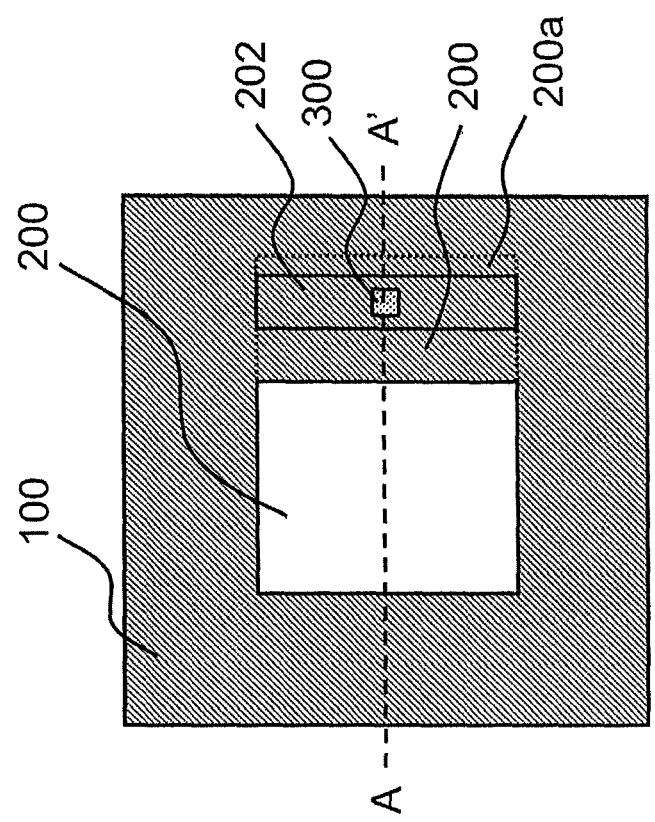

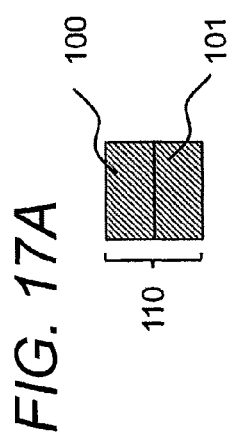
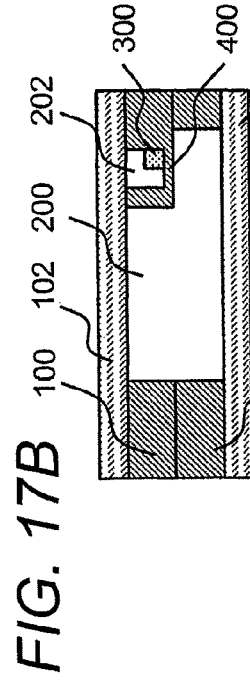
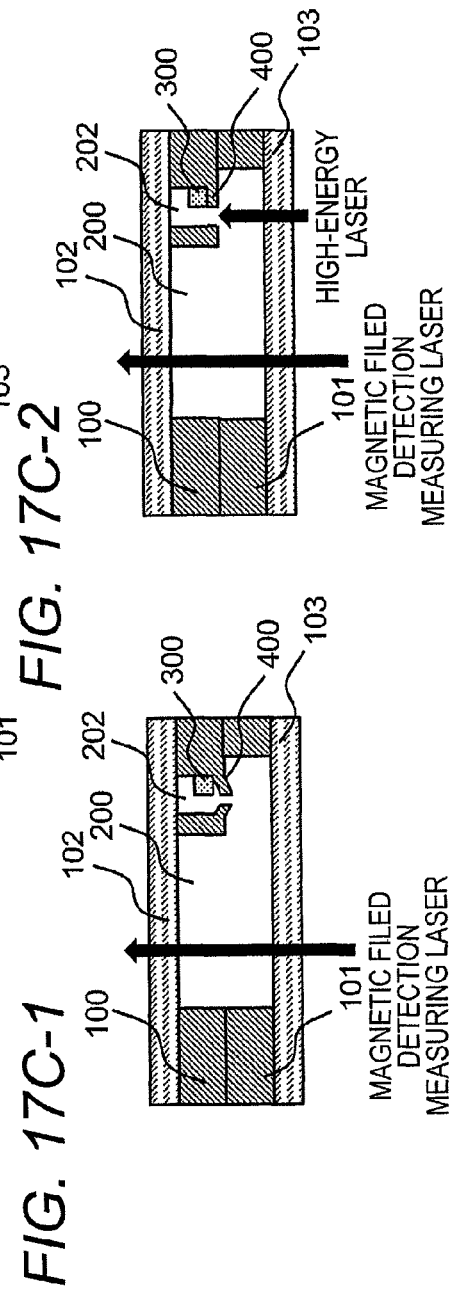

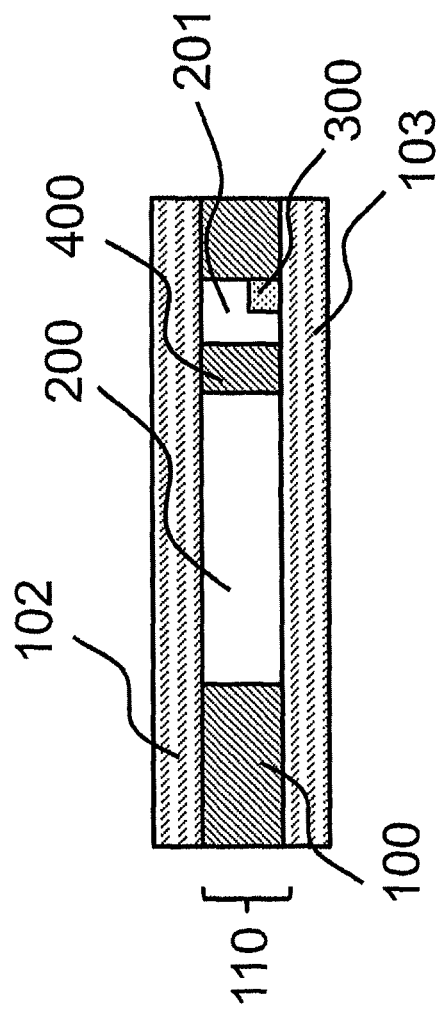

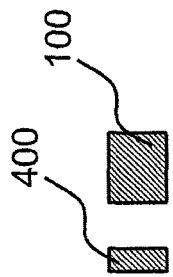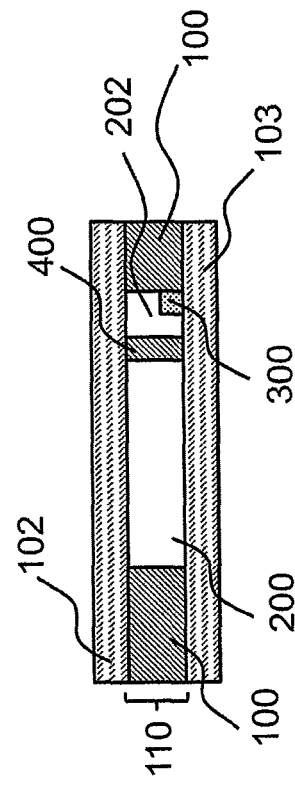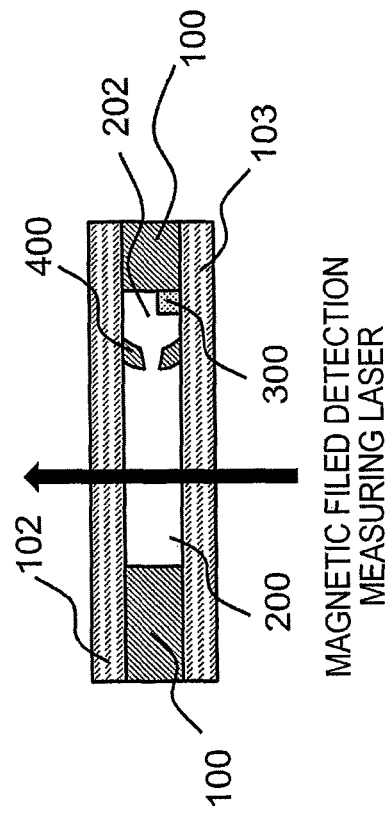

MAGNETIC FIELD MEASURING APPARATUS AND METHOD FOR MANUFACTURING SAME

BACKGROUND OF THE INVENTION

1. Field of the Invention

The present invention relates to a structure of a magnetic field measuring apparatus, and more particularly relates to a structure of a gas cell of an optically pumped magnetometer, and a method for manufacturing the apparatus.

2. Description of the Related Art

A high-sensitivity optically pumped magnetometer highly integrated into a small size has been developed, and there is W. Clark Griffith, Svenja Knappe, and John Kitching, "Femtotesla atomic magnetometry in a microfabricated vapor cell", Optics Express 18, 27167-27172 (2010) as background art in this technical field.

A gas cell of an optically pumped magnetometer described in W. Clark Griffith, Svenja Knappe, and John Kitching, "Femtotesla atomic magnetometry in a microfabricated vapor cell", Optics Express 18, 27167-27172 (2010) is configured such that both surfaces of a silicon substrate in which a penetrating hole (cavity) is formed are bonded with glass substrates, and is made of a three-layer structure including glass/silicon/glass to seal rubidium chloride (RbCl) generating alkali metal gas atoms in the penetrating hole and barium azide ($BaN_6$) generating nitrogen gas serving as buffer gas.

The magnetometer using the gas cell operates as follows. Circular-polarized pump light is emitted to the alkali metal gas atoms sealed in the gas cell, whereby the alkali metal gas atoms are spin-polarized by optical pumping method. Subsequently, linearly-polarized probe light is emitted in a direction perpendicular to the pump light, the plane of polarization of the probe light is rotated by magneto-optic effect called Faraday rotation. The plane of polarized light rotates by an angle proportional to the static magnetic field strength in a direction perpendicular to the optical path of the probe light, and therefore, the magnetic field strength can be measured by causing a light detection device to detect the angle of the plane of polarization of the probe light that has passed the gas cell.

A magnetometer that can be achieved using a similar gas cell is a magnetometer called a magneto-optical double resonance-type optically pumped magnetometer, or an Mx-type optically pumped magnetometer. The magneto-optical double resonance-type optically pumped magnetometer operates as follows. Circular-polarized laser light is emitted to the alkali metal gas atoms sealed in the gas cell, whereby the alkali metal gas atoms are spin-polarized by optical pumping method. The spin-polarized alkali metal gas atoms make precession movement with a frequency proportional to the static magnetic field strength in the gas cell. At this occasion, when an RF magnetic field of the same frequency as the frequency of the precession movement is applied to the gas cell, the light that passes the gas cell indicates the resonance peak due to the magneto-optical double resonance. This resonance peak is detected by the light detection device, and the static magnetic field strength can be measured from conversion from the frequency of the applied RF magnetic field (corresponding to the frequency of the precession movement).

As described above, in any of the magnetic field measuring methods, the optically pumped magnetometer performs the magnetic field measuring by using the spin-polarization state of the alkali metal gas and the change in the optical information generated in accordance thereto. Therefore, in the optically pumped magnetometer, it is important to maintain the spin-polarized state of the alkali metal gas atoms for a long time. In order to solve such problem, W. Clark Griffith, Svenja Knappe, and John Kitching, "Femtotesla atomic magnetometry in a microfabricated vapor cell", Optics Express 18, 27167-27172 (2010) describes a method for sealing not only the alkali metal gas atoms but also rare gas and nonmagnetic gas such as nitrogen gas (which are called buffer gases) in the gas cell. The time for which the alkali metal gas atoms are in the spin-polarized state depends on the pressure of the sealed buffer gas.

In the optically pumped magnetometer, the magnetic field measuring is performed by detecting the light that passes through the gas cell. For this reason, in order to prevent degradation of the light transmittance in the area where the light passes and to prevent reduction of the detected signal level, alkali metal solid matter such as rubidium and chemical compounds sealed in the gas cell such as barium azide need to be prevented from attaching to the area. In order to solve such problem, W. Clark Griffith, Svenja Knappe, and John Kitching, "Femtotesla atomic magnetometry in a microfabricated vapor cell", Optics Express 18, 27167-27172 (2010) describes a structure in which two penetrating holes having a dimension of 3 mm×2 mm×1 mm and a narrow passage having a dimension of 1 mm×0.1 mm×1 mm connecting the penetrating holes are formed in the gas cell, and the rubidium chloride and the barium azide are sealed in one of the penetrating holes, whereby unreacted residue and alkali metal are less likely to diffuse to the other of the penetrating holes where the light for the magnetic field measuring is passed.

SUMMARY OF INVENTION

In the gas cell described in W. Clark Griffith, Svenja Knappe, and John Kitching, "Femtotesla atomic magnetometry in a microfabricated vapor cell", Optics Express 18, 27167-27172 (2010), the rubidium chloride and the barium azide sealed in the penetrating hole are sealed and thereafter heated, so that the rubidium chloride and the barium azide are chemically reacted, whereby rubidium gas and nitrogen gas are generated. However, in the process of generating the buffer gas as a product of the chemical reaction, it is difficult to control the pressure in a quantitative manner in the gas cell, and the magnetic field measuring performance may vary in the manufactured magnetometer. Therefore, in a gas cell that has been manufactured with a deviation from the pressure of the manufacturing specification, there is also a problem in that the magnetic field measuring performance cannot be inspected until the magnetometer is structured by combining optical components such as a laser and magnetic components such as a coil, or it is necessary to add a troublesome process such as inspection using a measurement system such as a performance evaluation system separately structured for each gas cell. A method for directly measuring the pressure in the gas cell may be conducting destructive inspection of the gas cell, but this requires a destruction step and an inspection process, and in addition, after the inspection, it cannot be used as the gas cell, and therefore, this would not solve the problem described above.

When the unreacted residue such as the barium azide and non-gasified alkali metal solid matters attach to the area where the light for the magnetic field measuring is passed, the passage of the light is obstructed, and therefore, there is a problem in that the signal detection sensitivity of the resonance peak and the rotation angle of the plane of polarized light required for the magnetic field measuring are deteriorated, and the magnetic field measuring performance is reduced.

Even if, like in W. Clark Griffith, Svenja Knappe, and John Kitching, "Femtotesla atomic magnetometry in a microfabricated vapor cell", Optics Express 18, 27167-27172 (2010), the penetrating hole for sealing the alkali metal solid matter and the chemical compound and the penetrating hole through which the light passes are separated by the narrow passage in order to cope with the problem described above, it is impossible to totally prevent the diffusion that occurs via the narrow passage. Therefore, when the magnetic field measuring sensitivity of the magnetometer is increased, it is impossible to prevent deterioration of the magnetic field measuring sensitivity due to a tiny amount of alkali metal solid matter and chemical compound that diffuse to the area where the light for the magnetic field measuring is passed.

Further, even in a case where the structure explained above is used, during the processing of, e.g., heating for generating the alkali metal gas and the buffer gas in particular, it is also necessary perform control so that the temperature of the penetrating hole sealing the substance for generating the alkali metal gas and the buffer gas is less than the temperature of the other of the penetrating holes in which the light is passed. This is because the alkali metal gas atoms gasified to a saturation vapor pressure of a room temperature or higher when the alkali metal gas is generated are made into solid matter in an area where the temperature is lower and attach thereto.

In view of the problems described above, an object of the present invention is to provide a magnetic field measuring apparatus or a manufacturing method of the same, which facilitates the pressure control in the gas cell, or capable of inspecting the internal pressure of the gas cell without using any special process. Alternatively, another object of the present invention is to provide a magnetic field measuring apparatus or a manufacturing method of the same capable of detecting a magnetic field with a higher sensitivity.

Summary of the representative aspects of the invention disclosed in the present application will be described. A first aspect of the invention is a magnetic field measuring apparatus including: a first sealing member; a second sealing member; and a process layer sealed by the first sealing member and the second sealing member, wherein the process layer includes a first hollow portion in which alkali metal gas is sealed, and a second hollow portion provided opposed to the first hollow portion with a first isolation wall interposed therebetween.

A second aspect of the invention is a method for manufacturing a magnetic field measuring apparatus including a first sealing member, a second sealing member, and a process layer sealed by the first sealing member and the second sealing member, wherein the process layer includes a first hollow portion and a second hollow portion provided with a first isolation wall interposed therebetween, the method including: (a) generating alkali metal gas in the first hollow portion; and (b) after (a), breaking a portion of the first isolation wall by increasing the stress applied to the first isolation wall caused by the pressure inside of the first hollow portion to a level higher than a destructive limitation stress.

A third aspect of the invention is a method for manufacturing a magnetic field measuring apparatus including a first sealing member, a second sealing member, and a process layer sealed by the first sealing member and the second sealing member, wherein the process layer has a structure in which the first process member and the second process member are stacked, and a first hollow portion is provided inside of the first process member and inside of the second process member, and a second hollow portion is provided inside of the first process member with a first isolation wall interposed therebetween, the method including: (a) generating alkali metal gas in the second hollow portion; and (b) after (a), breaking a portion of the first isolation wall.

According to the present invention, a magnetic field measuring apparatus or a manufacturing method of the same are provided, which facilitates the pressure control in the gas cell, or capable of inspecting the internal pressure of the gas cell without using any special step. Alternatively, a magnetic field measuring apparatus or a manufacturing method of the same capable of detecting a magnetic field with a higher sensitivity can be provided.

BRIEF DESCRIPTION OF DRAWINGS

FIG. 2 is a schematic cross sectional view illustrating a gas cell according to the first embodiment;

FIGS. 3A and 3B are pressure inspection systems in the gas cell according to the first embodiment;

FIGS. 4A to 4E are manufacturing flow diagrams of the gas cell according to the first embodiment;

FIGS. 6A to 6C are schematic cross sectional views illustrating the gas cell according to the first embodiment;

FIGS. 7A to 7D are manufacturing flow diagrams of the gas cell according to the first embodiment;

FIGS. 8A to 8F are manufacturing flow diagrams of the gas cell according to the first embodiment;

FIGS. 11A and 11B illustrate pressure inspection systems in the gas cell according to the first embodiment;

FIG. 15 is a schematic top view illustrating the gas cell according to a second embodiment;

FIGS. 17A to 17C-2 are manufacturing flow diagrams of a gas cell according to the second embodiment;

FIG. 19 is a schematic cross sectional view illustrating the gas cell according to the second embodiment;

FIGS. 20A to 20C are manufacturing flow diagrams illustrating the gas cell according to the second embodiment;

DESCRIPTION OF THE PREFERRED EMBODIMENTS

A magnetic field measuring apparatus and method for manufacturing the same according to the present invention will be hereinafter explained with reference to embodiments and drawings.

First Embodiment

Basic Configuration

Figure 1:
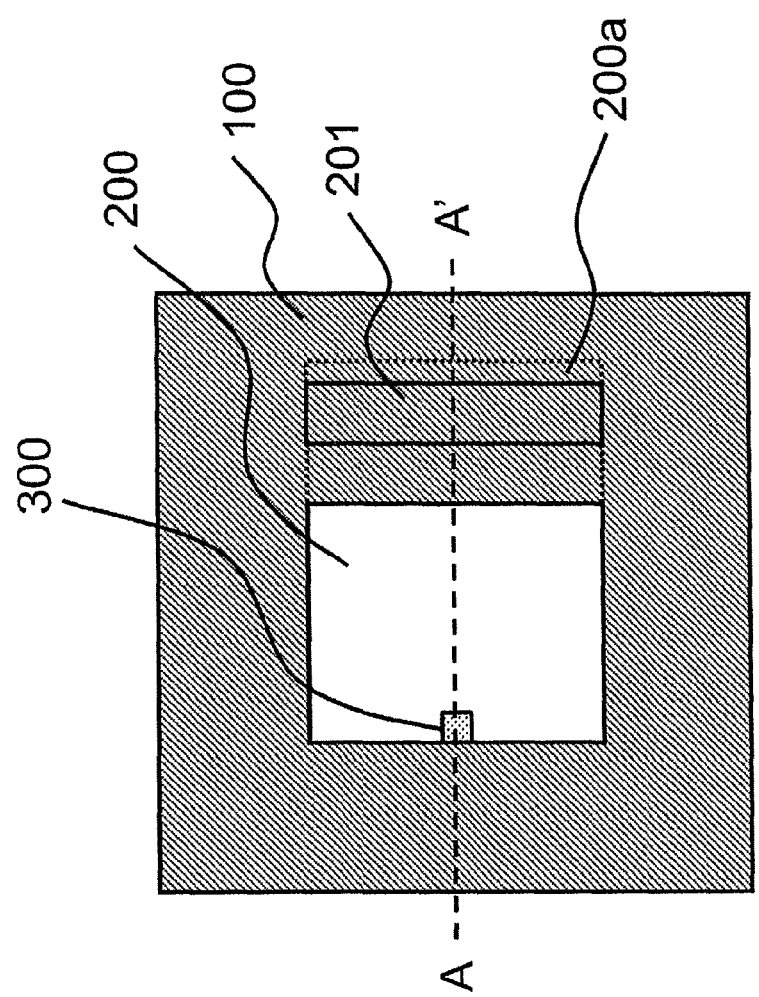
FIG. 1 is a schematic top view illustrating an optically pumped magnetometer gas cell according to a first embodiment of the present invention.

FIG. 1 is a schematic top view illustrating a magnetic field measuring apparatus (gas cell) according to the first embodiment of the present invention. FIG. 2 is a schematic cross sectional view taken along A-A' thereof. In FIGS. 1 and 2, a portion of a hollow section 200 is denoted as 200a for the sake of easy understanding. In FIG. 1, a sealing member 102 is omitted for the sake of easy understanding (it is also omitted in the schematic top views subsequent thereto). The hollow section 200a particularly indicates a lower area of non-processed portion of a substrate 100 and an area below the hollow section 201.

The gas cell of FIG. 2 has such a structure that a process layer 110 is sealed by sealing members 102 and 103. The process layer 110 is an area where the hollow portions 200 and 201 are provided. In the structure of FIG. 2, in particular, it is made of a two-layer structure including the process members 100 and 101.

In addition, the gas cell of FIG. 2 includes a sealing member 103, a process member 101, a process member 100, and a sealing member 102 which are arranged from the bottom, and has a four-layer configuration including a sealing member/a process member/a process member/a sealing member. The sealing member 102 and the sealing member 103 may be a transparent material which is transparent to the light in the wavelength band of laser for the magnetic field measuring. For example, glass and the like are used as the sealing member 102 and the sealing member 103. The process member 100 and the process member 101 have at least one or more penetrating holes or non-penetrating holes, or both of penetrating holes and non-penetrating holes processed therein. For example, a silicon substrate and the like are used as the process member 100 and the process member 101. The hollow portion 200 is constituted by the penetrating hole formed in the process member 100 and the process member 101, and this hollow portion 200 is sealed using the sealing member 102 and the sealing member 103. In contrast, the hollow section 201 is constituted by the non-penetrating hole formed in the process member 100, and this hollow section 201 is sealed using the sealing member 102.

In the hollow section 200, the alkali metal source 300 is sealed. The alkali metal source 300 is a solid matter or liquid. Each hollow section is sealed by the sealing members 102 and 103, and the atmosphere is, for example, vacuum, nitrogen gas, rare gas such as helium, or a mixed gas atmosphere thereof. It should be noted that the atmosphere in the hollow section 200 and the atmosphere in the hollow section 201 may be different. In FIGS. 1 and 2, the shapes of the hollow sections 200 and 201 are rectangles, but may be other polygonal shapes or shapes constituted by curved lines. The hollow sections 200 and 201 are isolated by a non-penetrating portion of the process member 100 (isolation wall 400), and are provided with the isolation wall 400 provided therebetween.

With the gas cell according to FIGS. 1 and 2, the magnetic field can be measured by emitting the laser light for magnetic field measurement to the alkali metal gas sealed in the hollow section 200 via the sealing member 102, the hollow section 200, and the sealing member 103.

FIGS. 3A and 3B are views schematically illustrating an inspection system for inspecting the pressure in the hollow section 200 of the gas cell. With the gas cell according to FIGS. 3A and 3B, pressure inspection laser light is emitted to the isolation wall 400 via the sealing member 102 and the hollow section 201 or the sealing member 103 and the hollow section 200, whereby the pressure in the hollow section 200 can be inspected. The reason for this will be hereinafter explained.

In the explanation below, for example, a case will be explained where the hollow section 200 and the hollow section 201 are vacuum-sealed. The alkali metal source 300 sealed in the hollow section 200 may be a substance that generates alkali metal gas. For example, a chemical compound including alkali metal is used as the alkali metal source 300, and the alkali metal gas can be generated in the hollow section 200 by performing thermal treatment, light emission, chemical reaction, and the like. After the gas is generated, the alkali metal gas, or the alkali metal gas and the buffer gas are filled in the hollow section 200, and the hollow section 201 is maintained under vacuum state.

For this reason, stress is applied to the isolation wall 400 isolating the hollow section 200 and the hollow section 201 in accordance with the pressure of the gas generated in the hollow section 200 and the shape and the wall thickness of the isolation wall 400. As a result, the isolation wall 400 is bent from the hollow section 200 to the hollow section 201, and this causes deformation and damage.

In a case where the isolation wall 400 is bent, and the amount of gas generated in the hollow section 200 is increased, then the pressure in the hollow section 200 increases, and the stress applied to the isolation wall 400 also increases, which bends the isolation wall 400 more greatly. The amount of bending can be calculated using four sides support uniformly distributed load model of structural mechanics, and is proportional to the load applied to the isolation wall 400. In the case of the present embodiment, the amount of bending changes in proportional to the pressure difference between the hollow section 200 and the hollow section 201. For example, the isolation wall 400 is in a rectangular parallelepiped shape having a short side of 2 mm, a long side of 4 mm, and a wall thickness of 100 µm, and the hollow section 200 is maintained at 100 kPa and the hollow section 201 is maintained under vacuum, a maximum bending stress of about 24 MPa is applied to the isolation wall 400, and a bending of about 1.4 µm is expected to occur. Therefore, by measuring the amount of bending of the isolation wall 400, the pressure in the hollow section 200 can be inspected. The measurement of the amount of bending can be evaluated by, for example, emitting laser light to the isolation wall 400 via the sealing member 102 and measuring the optical path length of the reflected laser light using an optical path length measuring system 500 (FIGS. 3A and 3B). It should be noted that the laser light may be emitted from the opposite side via the sealing member 103.

When the isolation wall shape and the wall thickness are designed so that the isolation wall 400 is broken in a case where the hollow section 200 is at a particular pressure or higher, the pressure in the hollow section 200 is considered to be able to be inspected based on whether the isolation wall 400 is broken or not. For example, the isolation wall 400 is in a rectangular parallelepiped shape having a short side of 2 mm, a long side of 4 mm, and a wall thickness of 10 µm, and the hollow section 200 is maintained at 100 kPa and the hollow section 201 is maintained under vacuum, a maximum bending stress of about 2.4 GPa is considered to be applied to the isolation wall 400, and therefore, a stress corresponding to a disruptive strength of the isolation wall 400 can be applied using the pressure difference between the hollow sections.

When the above is summarized, the magnetic field measuring apparatus according to the present embodiment includes a first sealing member 102, a second sealing member 103, and a process layer 110 sealed by the first sealing member and the second sealing member, and the process layer includes a first hollow portion 200 in which alkali metal gas is sealed and a second hollow portion 201 provided opposed to the first hollow portion with the first isolation wall 400 interposed therebetween.

With such structure, the pressure in the hollow section can be easily inspected without performing destructive inspection of the gas cell and measurement of the magnetic field measuring performance after the gas cell is manufactured.

In the structure of FIG. 2, further, the process layer is made of a structure in which the first process member 100 and the second process member 101 are stacked. The second hollow portion is sealed by the first sealing member provided in the first process member, but the first hollow portion is provided inside of the first process member and the second process member and is sealed by the first sealing member and the second sealing member.

With such feature, the isolation wall 400 can be formed between the process members 100 and 101, and therefore, the size of area and the shape of the isolation wall 400 can be designed in a relatively flexible manner, and as a result, there is an effect of increasing the pressure range that can be measured. Further, since the isolation wall 400 is formed in the horizontal direction, there is an effect of easily forming the wall thickness in a uniform manner.

In the structure of FIG. 2, there is the single hollow portion 201 in which the alkali metal is not sealed. As described above, when only the single hollow section 201 is formed, there is an effect of reducing the size of area of the hollow section 201 used for inspection of the gas cell.

<Method for Manufacturing Gas Cell>

Subsequently, a method for manufacturing a gas cell for carrying out the present embodiment will be explained with reference to FIGS. 4A to 4E. FIGS. 4A to 4E illustrate a method for manufacturing the gas cell according to the present embodiment.

In the present embodiment, for example, silicon substrates are used for the process member 100 and the process member 101, and glass is used for the sealing member 102 and the sealing member 103. First, the pattern of the hollow section 201 is formed in a mask material 104 formed on the process member 100 using lithography and the like, and processing is done by etching and the like (FIG. 4A). For example, oxide silicon is used for the mask material, and a non-penetrating hole is formed by dry etching using silicon tetrafluoride gas. The cross sectional shape of the non-penetrating hole may not be vertical, and may have a diagonal cross sectional shape or may have steps. For this reason, processing may also be done by wet etching using potassium hydroxide solution and the like or by laser, a drill, and the like.

Subsequently, using lithography and the like, the pattern of the hollow section 200 is formed in the mask material 104 that is formed again on the process member 100 in which the hollow section 201 is processed, and a penetrating hole is formed by etching and the like (FIG. 4B). In this case, the order in which the hollow sections 200 and 201 are formed is not particularly limited, and therefore, the hollow section 200 may be formed before the non-penetrating hole of the hollow section 201. Alternatively, the hollow sections 200 and 201 may be formed at a time.

Subsequently, using the lithography and the like, the pattern of the hollow section 200 is formed in the mask material 105 formed on the process member 101, and a penetrating hole is formed by etching and the like (FIG. 4C).

Subsequently, the process members 100 and 101 thus processed are bonded (FIG. 4D). For example, when silicon substrates are used, there is a method of bonding them with thermal bonding. At this occasion, in the area where the hollow section 200 is formed, it is sufficient to make an area that penetrates in a direction perpendicular to the process member and that passes laser light, and the connection of the side surface portions of the penetrating hole of the process member 100 and the process member 101 are not necessarily required to be continuously smooth. In other words, there may be a step formed at the connection portion between the process member 100 and the process member 101.

Finally, the sealing member 102 and the sealing member 103 are bonded while the alkali metal source 300 is contained in the hollow section 200, and the hollow sections 200 and 201 are sealed (FIG. 4E). For example, when the silicon substrate and the borosilicate glass are used, they can be bonded by anodic bonding. At this occasion, by controlling the atmosphere during bonding, the hollow sections 200 and 201 can be adjusted to be under vacuum or under the atmospheres of nitrogen gas, rare gas, or the like. When the hollow section 200 and the hollow section 201 are sealed under different atmospheres or at different pressures, the order in which the sealing member 102 and the sealing member 103 are bonded may be adjusted. For example, in a case where the hollow section 200 is sealed under the nitrogen atmosphere and the hollow section 201 is sealed under the vacuum atmosphere, this can be realized as follows. First, the sealing member 102 is bonded under the vacuum atmosphere, and after the hollow section 201 is sealed under vacuum, the sealing member 103 is sealed under the nitrogen gas atmosphere, and the nitrogen gas is sealed in the hollow section 200. When nonmagnetic gas such as nitrogen gas and rare gas such as helium gas are sealed, the gas acts as buffer gas, and there is an effect of suppressing spin scattering of the alkali metal gas. Since it is sufficient to seal the hollow sections, the sealing members may be bonded using an adhesive agent and the like. According to such manufacturing procedure, the gas cell as shown in FIGS. 1 and 2 can be realized.

<Modifications in which Multiple Hollow Portions 201 are Provided and Method for Manufacturing the Same>

Figure 5A:
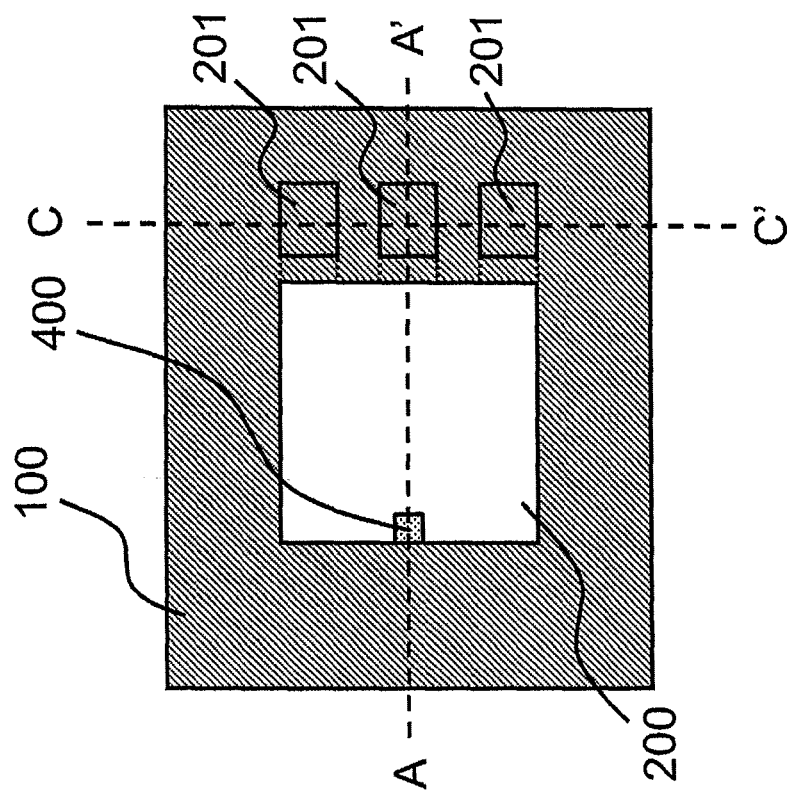
FIGS. 5A and 5B are schematic top views illustrating the gas cell according to the first embodiment.
Figure 5B:
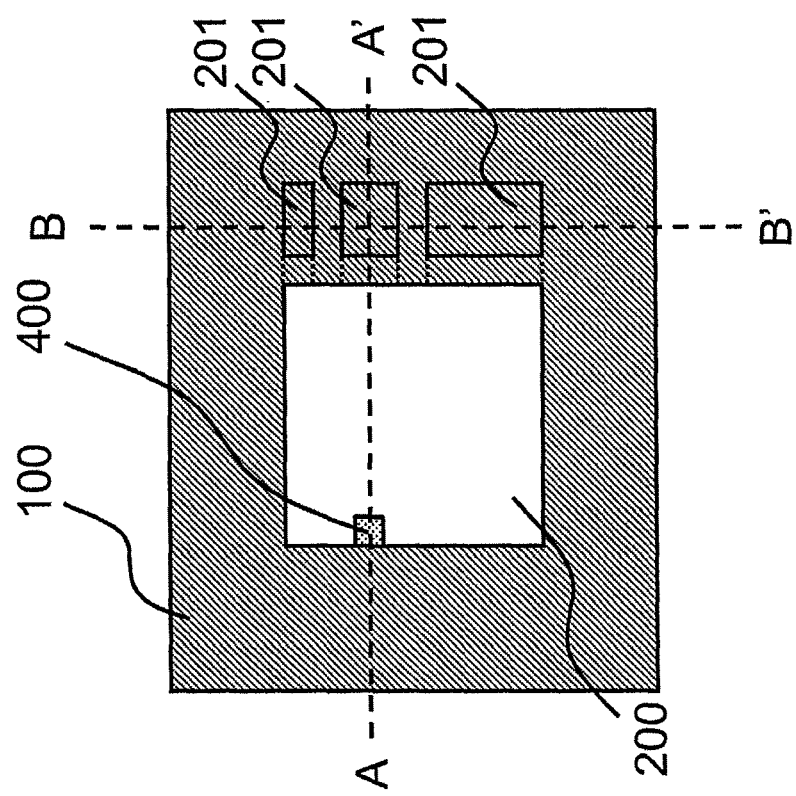

In. FIGS. 5A and 5 B and FIGS. 6A to 6C, modifications in which multiple hollow portions 201 are provided will be explained. FIGS. 5A and 5B are schematic top views illustrating a gas cell according to the present embodiment. FIG. 5A illustrates an example of modifications in which the sizes of areas of the hollow sections 201 are different. FIG. 5B illustrates an example of modifications in which the wall thicknesses of the isolation walls 400 isolating the hollow sections 201 are different.

FIGS. 6A, 6B, and 6C are schematic cross sectional views taken along A-A' or A"-A'", B-B', and C-C' in FIGS. 5A and 5B. In FIGS. 5A and 5B and FIGS. 6A to 6C a portion of a hollow section 200 is denoted as 200a for the sake of easy understanding. The hollow section 200a particularly indicates a lower area of non-processed portion of a substrate 100 and an area below the hollow section 201.

The hollow section 200 and the hollow sections 201 are isolated by the non-penetrating portion (isolation wall 400) of the process member 100. However, the size of areas or the shapes of the hollow sections 201, or both of the size of areas and the shapes of the hollow sections 201 are different (FIGS. 5A and 5B). Any one of the size of areas, the shapes, and the wall thicknesses of the isolation walls 400 isolating the hollow sections 201, or two or more of the size of areas, the shapes, and the wall thicknesses of the isolation walls 400 isolating the hollow sections 201 are different (FIGS. 5A and 5B, and FIGS. 6A to 6C).

The effects of the gas cell having multiple hollow sections 201 where the sizes of areas and the wall thicknesses of the isolation walls 400 are different will be hereinafter explained. For example, a case where the hollow section 200 and the hollow sections 201 are sealed under vacuum will be considered.

In the gas cell, the alkali metal source 300 is sealed in the hollow section 200. For example, a chemical compound including alkali metal is used, and the alkali metal gas is generated by performing thermal treatment, light emission, chemical reaction, and the like. After the alkali metal gas is generated, the alkali metal gas, or the alkali metal gas and the buffer gas are filled in the hollow section 200, and the hollow sections 201 are maintained under vacuum state. Therefore, deformation and damage such as bending may occur in each isolation wall as described in FIGS. 3A and 3B. However, even if the pressure in the hollow section 200 is the same, the amount of displacement due to the deformation of each isolation wall 400 and whether the isolation wall 400 is damaged or not are different. This is because each isolation wall 400 is formed to have different sizes of areas, shapes, and wall thicknesses, and therefore, the stress given to each isolation wall 400 is different under the same load. More specifically, when the pressure (load) in the hollow section 200 and the wall thicknesses and the shapes of the isolation walls 400 are the same, the maximum stress applied to the isolation wall 400 and the amount of displacement of the isolation wall 400 increase as the size of area of the isolation wall 400 increases. When the pressure in the hollow section 200 and the sizes of areas and the shapes of the isolation walls 400 are the same, the maximum stress applied to the isolation wall 400 and the amount of displacement of the isolation wall 400 decrease as the wall thickness increases. Therefore, by forming isolation walls 400 (hollow sections 201) having various sizes of areas and wall thicknesses in the gas cell, it is possible to manufacture a gas cell in which the amount of displacement of each isolation wall 400 and whether the isolation wall 400 is damaged or not are different after the alkali metal gas is generated. Therefore, the pressure in the hollow section 200 can be more accurately inspected by appropriately designing the size of area and the wall thickness of each isolation wall and comparing the states of each of them.

For example, the following case will be explained: the alkali metal gas and the buffer gas are generated from, for example, the alkali metal source 300, and the pressure in the hollow section 200 is to be controlled where the specification is 225 kPa and the allowable tolerance is 25 kPa.

At this occasion, for example, the design is made such that, when the pressure in the hollow section 200 attains 200 kPa in the gas cell having three hollow sections 201 described in FIGS. 5A and 5B, the isolation wall 400 of which size of area is the largest or of which wall thickness is the thinnest is broken. Likewise, when the pressure in the hollow section 200 attains 225 kPa, the isolation wall 400 of which size of area is the second largest or of which wall thickness is the thinnest is designed to be broken, and when the pressure in the hollow section 200 attains 205 kPa, the isolation wall 400 of which size of area is the smallest or of which wall thickness is the thickest is designed to be broken. As a result, the pressure in the hollow section 200 can be controlled to be equal to or more than 200 kPa and equal to or less than 250 kPa according to the specification pressure by controlling the generation process of the alkali metal gas and the buffer gas so that the isolation wall 400 that is designed to be broken at 200 kPa is broken and the isolation wall 400 that is designed to be broken at 250 kPa is not broken. More specifically, when multiple hollow sections 201 are formed, the pressure in the hollow section 200 can be accurately found by just performing inspection of confirming whether the isolation walls 400 are damaged or not. Therefore, there is an effect that even when a process for generating the buffer gas as the product of chemical reaction is used, the pressure of each gas cell can be accurately controlled and inspected.

As described above, in the magnetic field measuring apparatus according to the present modification, the process layer further includes a third hollow portion provided opposed to the first hollow portion with a second isolation wall interposed therebetween, and a stress that occurs with the second isolation wall when a predetermined pressure is applied is different from that of the first isolation wall.

This structure has the following effects as compared with the structure of FIG. 1. When only a single hollow section 201 is provided as shown in FIG. 1, the range of the pressure in the hollow section 200 cannot be found by just confirming the damage, and it is necessary to derive it from the inspection of the amount of displacement caused by deformation. In contrast, when multiple hollow sections 201 are formed and the designs of the sizes of areas and the wall thicknesses of the isolation walls are changed, the pressure in the gas cell can be controlled in a pressure range other than the above example, and inspection can be performed under more detailed conditions.

FIGS. 7A to 7D illustrate a method for manufacturing multiple isolation walls 400 of which sizes of areas are different. For example, a case will be hereinafter explained where silicon substrates are used for the process member 100 and the process member 101, and glass is used for the sealing member 102 and the sealing member 103.

First, using lithography and the like, the patterns of the hollow sections 201 of which sizes of areas are different are formed in the mask material 104 formed on the process member 100, and processing is done by etching and the like FIG. 7A. This process corresponds to formation of multiple non-penetrating holes of which sizes of areas are different at a time in the process of FIG. 4A. For example, oxide silicon is used for the mask material, and a non-penetrating hole can be formed by dry etching using silicon tetrafluoride gas. The cross sectional shape of the non-penetrating hole may not be vertical, and may have a diagonal cross sectional shape or may have steps. For this reason, processing may also be done by wet etching using potassium hydroxide solution and the like or by laser, a drill, and the like. After FIG. 7A or in the previous step, along A-A' of the process member 100 FIG. 5A and FIG. 6A, penetrating holes are formed according to the same process as FIG. 4B. However, since there is no change along B-B' of the process member 101, this is omitted in FIGS. 7A to 7D.

Subsequently, using lithography and the like, the pattern of the hollow section 200 is formed in the mask material 105 that is formed on the process member 101, and penetrating holes are formed by etching and the like (FIG. 7B).

Subsequently, the process member 100 and the process member 101 thus processed are bonded (FIG. 7C). The bonding method is the same as that of FIG. 4D. At this occasion, the sizes of areas of the isolation walls 400 isolating the hollow section 200 and the hollow sections 201 are different depending on each isolation wall 400. The distance between the hollow sections 201 is desired to be sufficiently thick, for example, it may be equal to or more than 1 mm, which is sufficiently thick as compared with the wall thickness of the isolation wall 400.

Finally, the sealing member 102 and the sealing member 103 are bonded while the alkali metal source 300 is contained in the hollow section 200, and the hollow sections 200 and 201 are sealed (FIG. 7D). For example, when the silicon substrate and the borosilicate glass are used, they can be bonded by anodic bonding. At this occasion, by controlling the atmosphere during bonding, the hollow sections can be adjusted to be under vacuum or under the atmospheres of nitrogen gas, rare gas, or the like.

When manufactured according to such processes, the gas cell having multiple hollow sections 201 of which sizes of areas of isolation walls 400 are different can be formed.

FIGS. 8A to 8F illustrate a method for manufacturing multiple isolation walls 400 of which wall thicknesses are different. For example, a case will be hereinafter explained where silicon substrates are used for the process member 100 and the process member 101, and glass is used for the sealing member 102 and the sealing member 103.

First, using lithography and the like, the patterns of the hollow sections 201 having desired sizes of areas are formed in the mask material 104 formed on the sealing member 100, and processing is done by etching and the like (FIG. 8A). Like FIG. 7A, oxide silicon is used for the mask material, and processing can be done by dry etching using silicon tetrafluoride gas.

Subsequently, using lithography and the like, the patterns of the hollow sections 201 are formed at two locations in the mask material 104 that is formed again on the process member 100 processed in FIG. 8A, and processing is done by etching and the like FIG. 8A (FIG. 8B). One of the hollow sections 201 processed in the process of FIG. 8B is configured to be the same as the hollow section 201 processed in FIG. 8A. Therefore, one of the hollow sections 201 is processed again, so that the non-penetrating hole can be formed deeply.

Subsequently, the patterns of the hollow sections 201 are formed at three locations, and three hollow sections 201 of which processing depths are different are formed according to the same method as FIG. 8B (FIG. 8C). In FIGS. 8A to 8C, for example, a case has been explained where the three hollow sections 201 of which processing depths are different are formed. Alternatively, two or three or more portions may be processed. The cross sectional shape of the non-penetrating hole may not be vertical, and may have a diagonal cross sectional shape or may have steps. For this reason, processing may also be done by wet etching using potassium hydroxide solution and the like or by laser, a drill, and the like.

Before FIG. 8A, or after FIG. 8C, or in a process between FIGS. 8A to 8C, penetrating holes are formed according to the same process as FIG. 4B along A-A' of the process member 100 (FIG. 5B and FIG. 6A). However, since there is no change along C-C' of the process member 100, this is omitted in FIGS. 8A to 8F.

Subsequently, using the lithography and the like, the pattern of the hollow section 200 is formed in the mask material 105 formed on the process member 101, and a penetrating hole is formed by etching and the like FIG. 8D.

The process members 100 and the process member 101 thus processed are bonded can be bonded according to the same method as that of FIG. 7C (FIG. 8E). At this occasion, the wall thickness of the isolation wall 400 isolating the hollow section 200 and the hollow section 201 is different depending on each isolation 400 wall.

Finally, the sealing member 102 and the sealing member 103 are bonded while the alkali metal source 300 is contained in the hollow section 200, and the hollow sections 200 and 201 are sealed (FIG. 8F).

When manufactured according to such processes, the gas cell having multiple hollow sections 201 of which isolation wall thicknesses are different can be formed.

<Modifications in which Process Layer is Made of One Layer of Process Member and Method for Manufacturing the Same>

Figure 9:
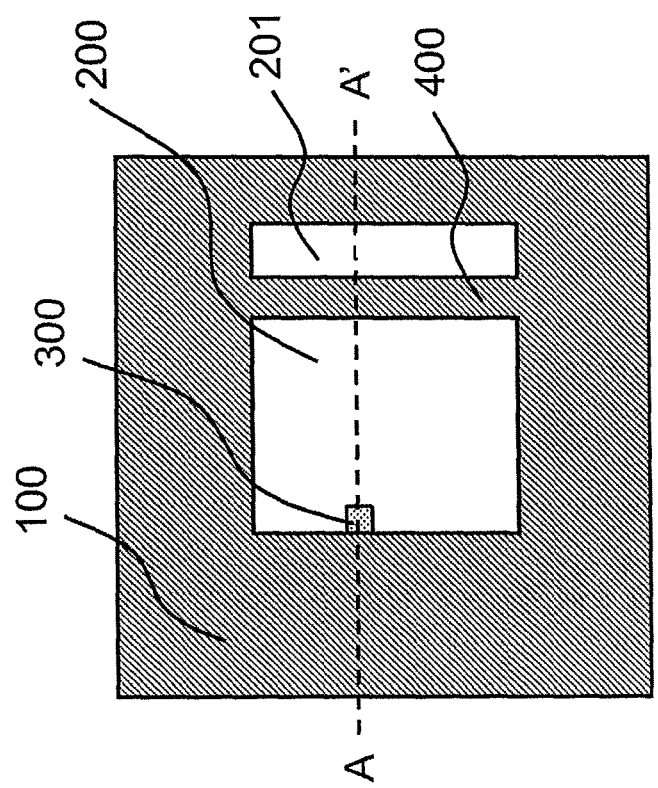
FIG. 9 is a schematic top view illustrating the gas cell according to the first embodiment.
Figure 10:
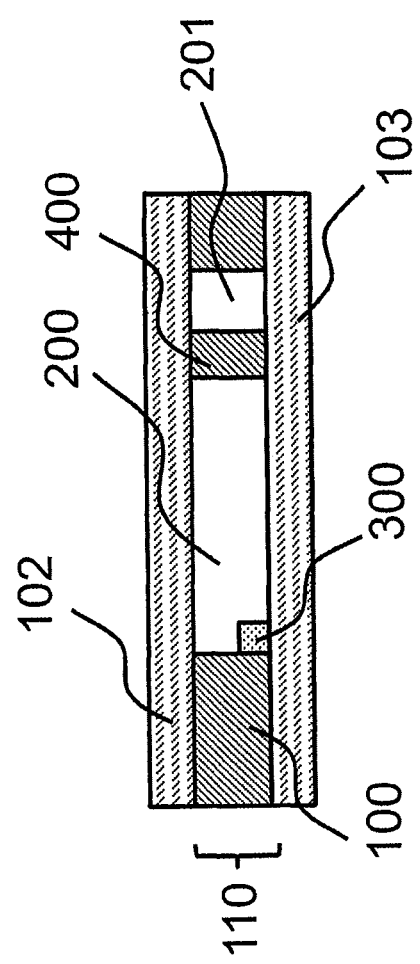
FIG. 10 is a schematic cross sectional view illustrating the gas cell according to the first embodiment.

FIG. 9 is a schematic top view illustrating a gas cell. FIG. 10 is a schematic cross sectional view take along A-A' cross section thereof. In the gas cell of FIG. 9, the process layer 110 is made of one layer structure of the process member 100.

The gas cell of FIG. 9 includes a sealing member 103, a process member 100, and a sealing member 102 which are arranged from the bottom, and has a three-layer configuration including a sealing member/a process member/a sealing member. The sealing member 102 and the sealing member 103 may be a transparent material which is transparent to the light in the wavelength band of laser for the magnetic field measuring. For example, glass and the like are used as the sealing member 102 and the sealing member 103. The process member 100 has at least two or more penetrating holes processed therein. For example, a silicon substrate and the like are used as the process member 100.

The hollow section 200 and the hollow section 201 are constituted by the penetrating hole formed in the process member 100, and this hollow section 200 and this hollow section 201 are sealed using the sealing member 102 and the sealing member 103. In contrast, the hollow section 201 is isolated from the hollow section 200 by the isolation wall 400 formed in the process member 100. In FIG. 9, the shapes of the hollow sections 200 and 201 are rectangles, but may be other polygonal shapes or shapes constituted by curved lines The alkali metal source 300 is sealed in the hollow section 200. The alkali metal source 300 is the same as that in FIG. 1. Each hollow section is sealed by the sealing member 102 and the sealing member 103, and the atmosphere therein is maintained, for example, under vacuum. Other atmospheres such as nitrogen gas may be in the hollow sections 200 and 201, and the hollow sections 200 and 201 may have atmospheres different from each other.

With the gas cell according to FIGS. 9 and 10, the magnetic field can be measured by emitting the laser light for magnetic field measurement to the alkali metal gas sealed in the hollow section 200 via the sealing member 102, the hollow section 200, and the sealing member 103.

FIGS. 11A and 11B are views schematically illustrating an inspection system for inspecting the pressure in the hollow section 200 of the gas cell. With the gas cell according to FIGS. 11A and 11B pressure inspection laser light is emitted to the isolation wall 400 via the sealing member 102 and the hollow section 201 or the sealing member 103 and the hollow section 201, whereby the pressure in the hollow section 200 can be inspected. The reason for this will be hereinafter explained.

In the explanation below, for example, a case will be explained where the hollow section 200 and the hollow section 201 are vacuum-sealed. After the alkali metal gas and the buffer gas are generated using the alkali metal source 300 sealed in the hollow section 200, the alkali metal gas, or the alkali metal gas and the buffer gas are filled in the hollow section 200, and the hollow section 201 is maintained under vacuum state FIG. 11A.

For this reason, stress is applied to the isolation wall 400 in accordance with the pressure of the gas generated in the hollow section 200 and the shape and the wall thickness of the isolation wall 400. As a result, the isolation wall 400 is bent from the hollow section 200 to the hollow section 201, and this causes deformation as shown in FIG. 11B. Therefore, like the method described using FIG. 1, FIG. 2, and FIGS. 3A and 3B, the pressure in the hollow section 200 can be inspected by measuring the amount of bending of the isolation wall 400.

The measurement of the amount of bending can done by emitting laser light from the light source 501 via the glass substrate 102 and measuring the strength of the laser light passing through the gas cell using a light detection device 502. The light generated from the light source 501 and the bent isolation wall 400 cross each other, the light is reflected, and the light is not detected by the light detection device 502. Therefore, by scanning the light source 501 in the displacement direction of the isolation wall 400, the amount of displacement of the isolation wall 400 due to the generation of the alkali metal gas and the buffer gas can be evaluated FIGS. 11A and 11B. At this occasion, the positions of the light source 501 and the light detection device 502 are switched, and the laser light may be emitted via the glass substrate 103. The laser light may be scanned in the direction opposite to the displacement direction of the isolation wall 400, or may be fixed without scanning.

When the isolation wall shape and the wall thickness are designed so that the isolation wall 400 is broken when the hollow section 200 attains a particular pressure or higher, the pressure in the hollow section 200 can be inspected on the basis of whether the isolation wall 400 is broken or not.

As described above, the magnetic field measuring apparatus according to the present modification is characterized in that the first hollow portion and the second hollow portion are sealed by the first sealing member and the second sealing member.

In such gas cell structure, the hollow section 201 is formed by the penetrating hole, and therefore, there is an effect of forming the hollow section 200 and the formed penetrating hole at a time.

Figure 12:
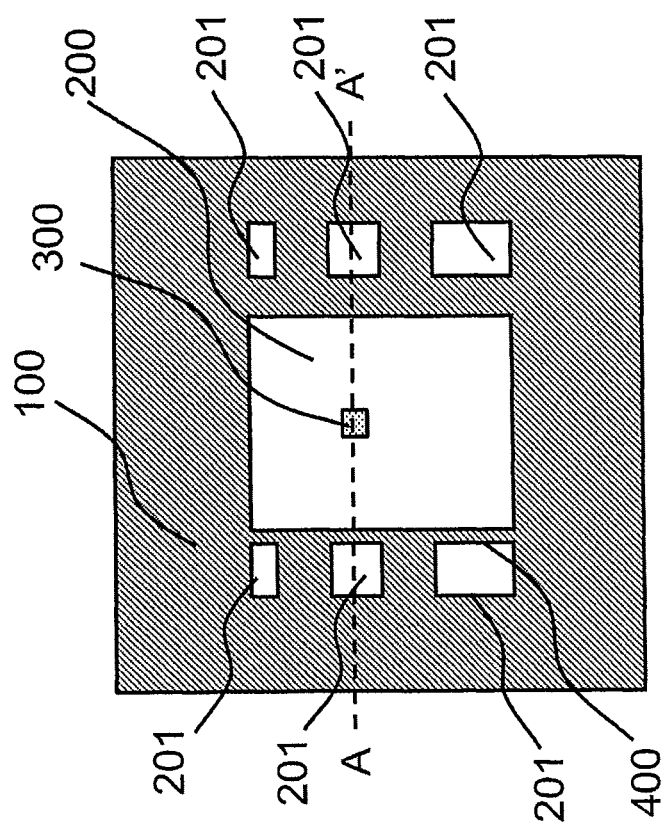
FIG. 12 is a schematic top view illustrating the gas cell according to the first embodiment.
Figure 13:
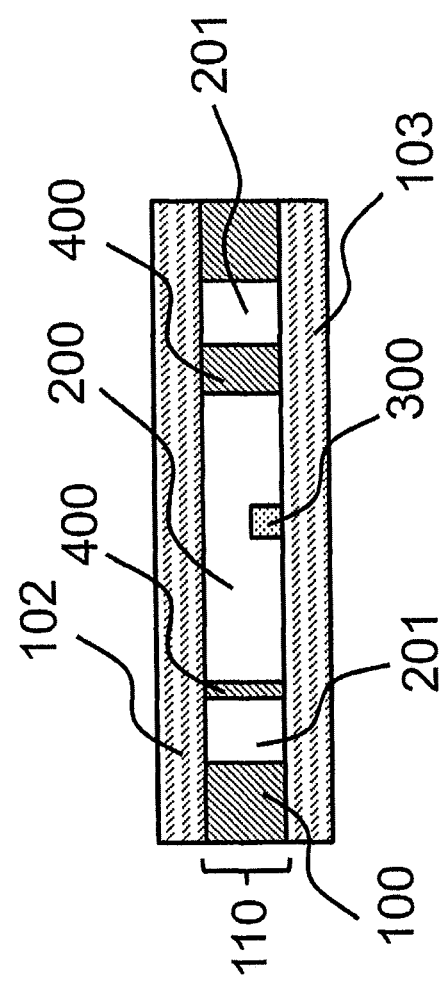
FIG. 13 is a schematic cross sectional view illustrating the gas cell according to the first embodiment.

Moreover, like FIGS. 5A and 5B the gas cell having multiple hollow sections 201 where the sizes of areas and the wall thicknesses of the isolation walls 400 are different may be used. FIG. 12 is a schematic top view illustrating the process member 100 of the gas cell. FIG. 13 is a schematic cross sectional view taken along the A-A' cross section thereof.

In such gas cell structure, the same pressure inspection as FIGS. 5A and 5B and FIGS. 6A to 6C can be done by adjusting the size of area and the wall thickness of each isolation wall 400.

Figure 14A:
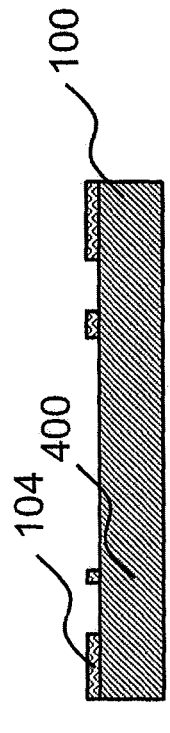
FIGS. 14A to 14C are manufacturing flow diagrams of the gas cell according to the first embodiment.
Figure 14B:
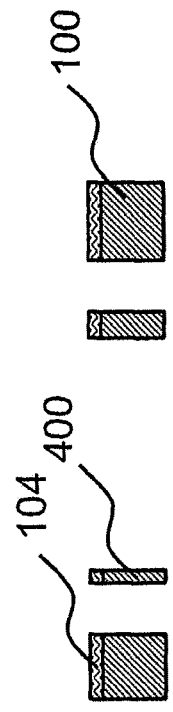
Figure 14C:
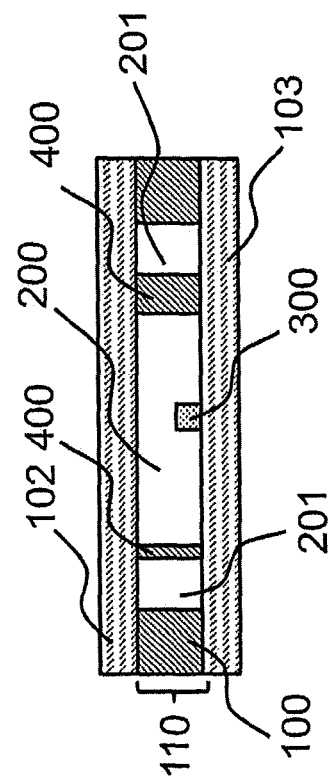

A method for manufacturing the gas cell according to FIGS. 9 to 13 will be explained with reference to FIGS. 14A to 14C. In FIGS. 14A to 14C, for example, a silicon substrate is used for the process member 100, and glass is used for the sealing member 102 and the sealing member 103.

First, the patterns of the hollow section 200 and the hollow section 201 are formed in a mask material 104 formed on the process member 100 using lithography and the like, and processing is done by etching and the like (FIG. 14A).

Subsequently, in a case of a gas cell structure described in FIGS. 9, 10, a hollow section 201 is formed at a location. In a case of a gas cell structure described in FIGS. 12 and 13, hollow sections 201 are formed at multiple locations. When the hollow sections 201 are formed at multiple locations, the sizes of area or the wall thicknesses of the isolation walls 400 formed in the process member 100 are processed to be different (FIG. 14B). The process of the process member 100 is the same as FIG. 4C. The cross sectional shape of the isolation wall 400 is preferably vertical, but may not be necessarily vertical as long as the shape can be controlled. For this reason, processing may also be done by wet etching using potassium hydroxide solution and the like or by laser, a drill, and the like. The distance between the hollow sections 201 is preferably, for example, several times the wall thickness of the isolation wall 400.

Finally, the sealing member 102 and the sealing member 103 are bonded while the alkali metal source 300 is contained in the hollow section 200, and the hollow sections 200 and 201 are sealed (FIG. 14C). The bonding method and the sealing atmosphere are the same as the method described in FIGS. 4A to 4E.

Second Embodiment

Figure 16:
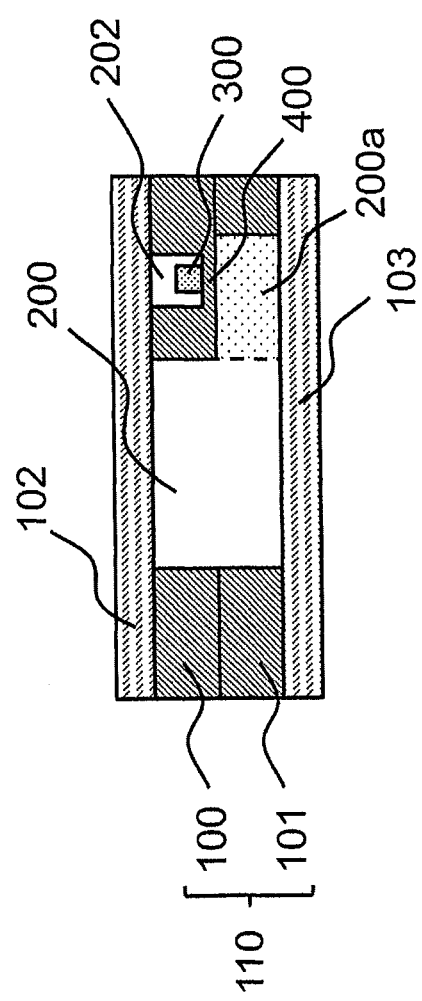
FIG. 16 is a schematic cross sectional view illustrating the gas cell according to the second embodiment.

FIG. 15 is a schematic top view illustrating a gas cell according to the second embodiment. FIG. 16 is a schematic cross sectional view taken along A-A' cross section. In FIGS. 15 and 16, a portion of a hollow section 200 is denoted as 200a for the sake of easy understanding. The hollow section 200a particularly indicates a lower area of non-processed portion of the process member 100 and an area below the hollow section 201.

The gas cell of FIG. 15 has such a structure that a process layer 110 is sealed by sealing members 102 and 103. The process layer 110 is an area where the hollow sections 200 and 202 are provided. In the structure of FIG. 15, in particular, it is made of a two-layer structure including the process members 100 and 101.

In addition, the gas cell of FIG. 15 includes a sealing member 103, a process member 101, a process member 100, and a sealing substrate 102 which are arranged from the bottom, and has a four-layer configuration including a sealing member/a process member/a process member/a sealing member. The structure of the gas cell is the same as FIG. 1 described in the first embodiment. However, the alkali metal source 300 is not sealed in the hollow section 200 but is sealed in the hollow section 202.

With the gas cell according to the second embodiment, like the first embodiment the magnetic field can be measured by emitting the laser light for magnetic field measurement to the alkali metal gas sealed in the hollow section 200. Further, with the gas cell according to FIG. 15, there are effects as follows: the hollow section 200 where the laser light for magnetic field measurement is passed is not contaminated by the alkali metal source 300 or the alkali metal solid matter, and the alkali metal gas, or the alkali metal gas and the buffer gas can be filled in the hollow section 200.

FIGS. 17A, 17B, 17C-1, and 17C-2 illustrate a method for manufacturing the gas cell according to the present embodiment. In the present embodiment, for example, a method for manufacturing the gas cell will be explained in a case where silicon substrates are used for the process member 100 and the process member 101, and glass is used for the sealing member 102 and the sealing member 103, and the hollow section 200 and the hollow section 202 are vacuum-sealed.

First, according to the same process as FIGS. 4A to 4D described in the first embodiment, the substrate 100 and the substrate 101 are bonded (FIG. 17A).

Subsequently, the sealing member 102 and the sealing member 103 are bonded while the alkali metal source 300 is contained in the hollow section 202, and the hollow sections 200 and 202 are sealed (FIG. 17B). The bonding method is the same as that of FIG. 4E described in the first embodiment.

The alkali metal source 300 sealed in the hollow section 202 is the same as the first embodiment, and by performing thermal treatment and the like, the alkali metal gas or the alkali metal gas and the buffer gas are generated to pressurize the hollow section 202.

After the gas is generated, the hollow section 200 is maintained under vacuum, and the alkali metal gas, or the alkali metal gas and the buffer gas are filled in the hollow section 202. For this reason, stress is applied to the isolation wall 400 isolating the hollow section 200 and the hollow section 202 in accordance with the pressure difference of the hollow section 200 and the hollow section 202. At this occasion, the size of area and the wall thickness of the isolation wall 400 is designed so that the isolation wall 400 is broken by the stress when the pressure in the hollow section 202 increases to attain a desired pressure, and the isolation wall 400 is broken by pressurizing the hollow section 202 to the desired pressure, so that the hollow section 200 and the hollow section 202 can be connected (FIG. 17C-1). Accordingly, while maintaining the alkali metal solid matter and the unreacted residue generated when the alkali metal gas is generated in the hollow section 202, only the alkali metal gas and the buffer gas can be filled in the hollow section 200. Therefore, there is an advantage in that the transmittance of the laser for magnetic field measurement passing through the hollow section 200 is prevented from decreasing due to the unreacted residue and the alkali metal solid matter. In this case, in general, the saturation vapor pressure of the nonmagnetic gas or the rare gas is higher than the saturation vapor pressure of the alkali metal gas, and therefore, not only the alkali metal gas but also the second gas made of the nonmagnetic gas or the rare gas are generated in the hollow section 202, so that the isolation wall can be more easily broken with the increase in the pressure of the second gas after that. In this case, the nonmagnetic gas or the rare gas is explained as the buffer gas, but may be sealed for other purposes. In any case, it is sufficient if at least the stress applied to the isolation wall 400 by the pressure in the hollow section 202 is higher than the destructive limitation stress.

Another connecting method is as follows: after the alkali metal gas and buffer gas are generated in the hollow section 202, the high-energy laser is emitted to break the isolation wall 400, whereby the hollow section 200 and the hollow section 202 can be connected (FIG. 17C-2). The high-energy laser may be, for example, harmonics of YAG laser.

Figure 18:
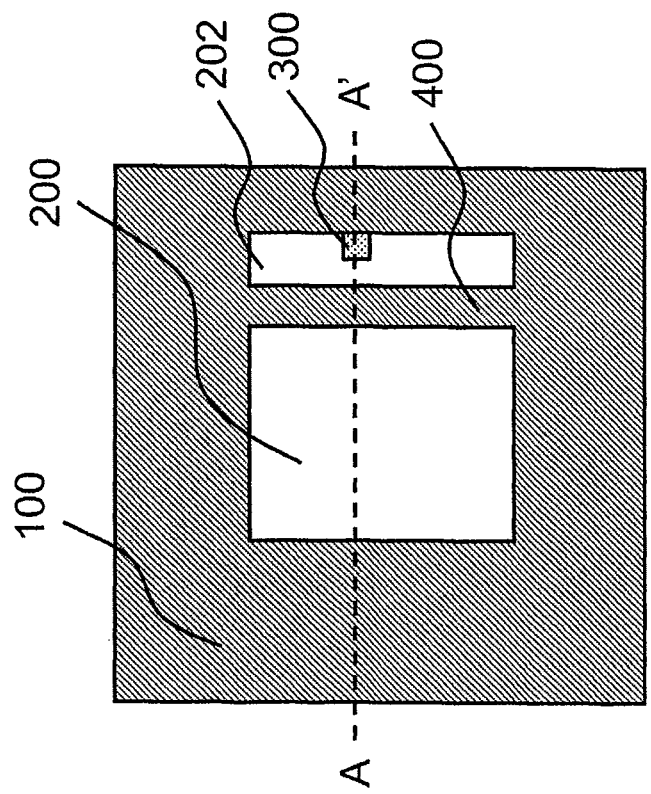
FIG. 18 is a schematic top view illustrating the gas cell according to the second embodiment.

The method for manufacturing the gas cell for breaking the isolation wall 400 by increasing the pressure in the hollow section 202 explained in FIG. 17C-1 can also be applied to the gas cell explained in FIGS. 9 and 10. FIG. 18 is a schematic top view illustrating a gas cell. FIG. 19 is a schematic cross sectional view along the A-A' cross section thereof. The structure of the gas cell of FIGS. 18 and 19 is the same as that in FIGS. 9 and 10 described in the first embodiment. However, the alkali metal source 300 is sealed in the hollow section 202.

The laser light for magnetic field measurement is emitted to the alkali metal gas sealed in the hollow section 200, and the magnetic field is measured. In the gas cell structure described in FIGS. 18 and 19, the process layer 110 is made of the single process member 100, and gas cell structure achieves the same effect as the gas cell described in FIGS. 15 and 16.

FIGS. 20A to 20C illustrate a method for manufacturing the gas cell according to the present embodiment. In the present embodiment, for example, a method for manufacturing the gas cell will be explained in a case where silicon substrates are used for the process member 100, and glass is used for the sealing member 102 and the sealing member 103, and the hollow section 200 and the hollow section 202 are vacuum-sealed.

First, the process member 100 having at least two or more penetrating holes is processed according to the same process as that in FIG. 14B described in the first embodiment (FIG. 20A).

Subsequently, according to the same process as that in FIG. 14B described in the first embodiment, the process member 100 is sealed using the sealing member 102 and the sealing member 103, and the hollow sections 200 and 202 are formed in the gas cell. However, the alkali metal source 300 is sealed in the hollow section 202.

Finally, according to the same method as that in FIG. 17C-1, the hollow section 202 is pressurized by the alkali metal gas and the buffer gas to break the isolation wall 400, whereby the hollow section 200 and the hollow section 202 can be connected FIG. 20C.

When the above is summarized, in particular, the method for manufacturing the magnetic field measuring apparatus according to FIG. 17C-1 and FIG. 20C of the method for manufacturing the magnetic field measuring apparatus according to the present embodiment is a method for manufacturing a magnetic field measuring apparatus including a first sealing member, a second sealing member, and a process layer sealed by the first sealing member and the second sealing member, wherein the process layer includes a first hollow portion and a second hollow portion provided with a first isolation wall interposed therebetween. In addition, in particular, the method for manufacturing the magnetic field measuring apparatus according to FIG. 17C-1 and FIG. 20C includes A generating alkali metal gas in the first hollow portion, and (b) after (a), breaking a portion of the first isolation wall by increasing the stress applied to the first isolation wall caused by the pressure inside of the first hollow portion to a level higher than a destructive limitation stress.

With regard to such feature, there is an advantage in that the transmittance of the laser for magnetic field measurement passing through the second hollow portion is prevented from decreasing due to the unreacted residue and the alkali metal solid matter. Further, as compared with the method for manufacturing the magnetic field measuring apparatus according to FIG. 17C-2, there is an advantage in that the isolation wall can be broken without performing any special operation such as emitting high-energy laser.

The method for manufacturing the magnetic field measuring apparatus according to FIG. 17C-2 is a method for manufacturing a magnetic field measuring apparatus including a first sealing member, a second sealing member, and a process layer sealed by the first sealing member and the second sealing member, wherein the process layer has a structure in which the first process member and the second process member are stacked, and a first hollow portion is provided inside of the first process member and inside of the second process member, and a second hollow portion is provided inside of the first process member with a first isolation wall interposed therebetween. In addition, in particular, the method for manufacturing the magnetic field measuring apparatus according to FIG. 17C-2 includes (a) generating alkali metal gas in the second hollow portion, and (b) after (a), breaking a portion of the first isolation wall.

With regard to such feature, there is also an advantage, like the method for manufacturing the magnetic field measuring apparatus explained above, in that the transmittance of the laser for magnetic field measurement passing through the second hollow portion is prevented from decreasing due to the unreacted residue and the alkali metal solid matter. Further, as compared with the method for manufacturing the magnetic field measuring apparatus according to FIG. 17C-1, there is an advantage in that it is not necessary to excessively generate the alkali metal gas and the buffer gas in the first hollow portion.

Third Embodiment

Figure 21:
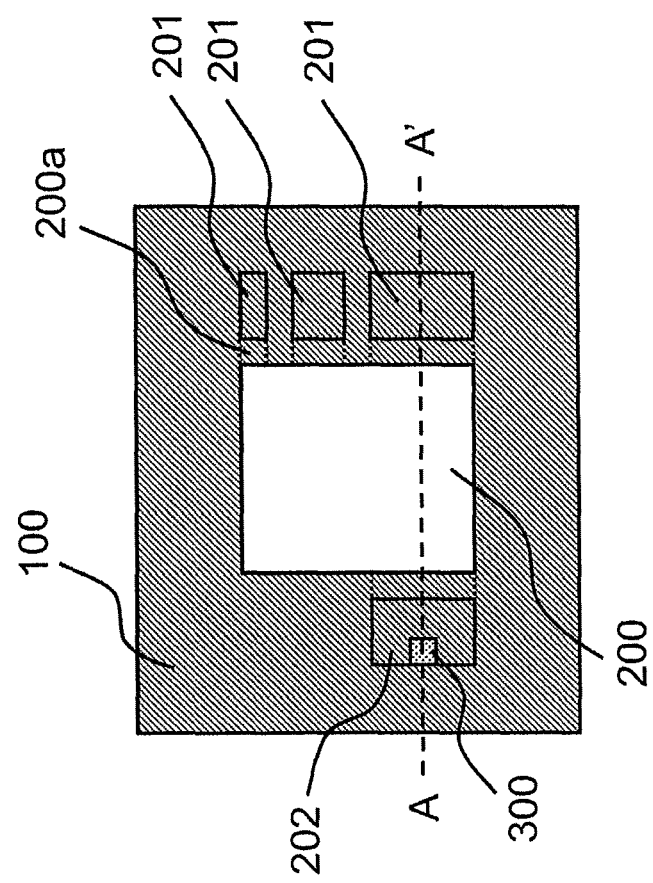
FIG. 21 is a schematic top view illustrating a gas cell according to a third embodiment.
Figure 22:
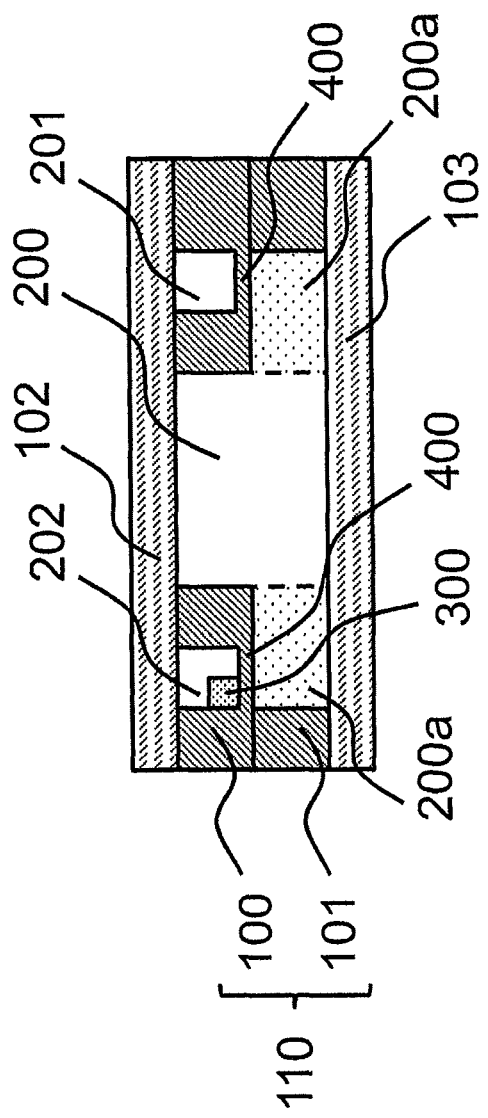
FIG. 22 is a schematic cross sectional view illustrating a gas cell according to the third embodiment.

FIG. 21 is a schematic top view illustrating a gas cell according to the third embodiment. FIG. 22 is a schematic cross sectional view along A-A' cross section.

In FIGS. 21 and 22, a portion of a hollow section 200 is denoted as 200a for the sake of easy understanding. The hollow section 200a particularly indicates a lower area of non-processed portion of the process member 100 and an area below the hollow section 201 and the hollow section 202.

The gas cell of FIG. 21 has a structure in which the process layer 110 is sealed by the sealing members 102 and 103. The process layer 110 is an area where the hollow sections 200, 201, and 202 are provided. In the structure of FIG. 21, in particular, the process layer 110 has a two-layer structure including the process members 100 and 101.

In addition, the gas cell of FIG. 21 includes a sealing member 103, a process member 101, a process member 100, and a sealing member 102 which are arranged from the bottom, and has a four-layer configuration including a sealing member/a process member/a process member/a sealing member. In the process member 100, the hollow section 201 described in FIGS. 1 and 2 of the first embodiment and the hollow section 202 described in FIGS. 15 and 16 of the second embodiment. More specifically, the hollow portion 200 is constituted by the penetrating hole formed in the process member 100 and the process member 101, and this hollow portion 200 is sealed using the sealing member 102 and the sealing member 103. In contrast, the hollow portions 201 and 202 are constituted by the non-penetrating hole formed in the process member 100, and these hollow portions 201 and 202 are sealed using the sealing member 102. The sealing member 102, the sealing member 103, the isolation wall 400, and the alkali metal source 300 are the same as those of the first embodiment and the second embodiment. The alkali metal source is sealed in the hollow section 202.

Figure 23:
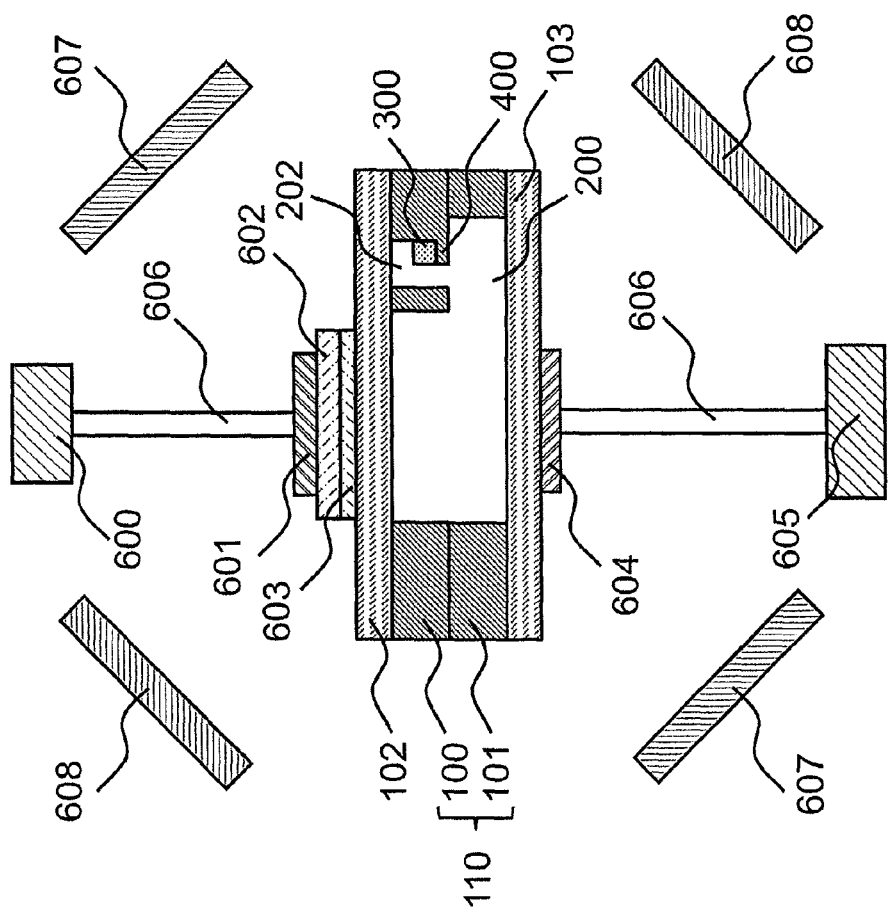
FIG. 23 is a magnetism measuring apparatus according to the third embodiment.

With the gas cell according to FIG. 23, the magnetic field can be measured by emitting the laser light for magnetic field measurement to the alkali metal gas sealed in the hollow section 200. Further, both of the effects described in the first embodiment and the effects described in the second embodiment can be realized. The reason for this will be hereinafter explained.

In the gas cell of FIG. 23, after the gas cell is formed, the thermal treatment and the like are performed with the alkali metal source 300 sealed in the hollow section 202, whereby the alkali metal gas or the alkali metal gas and the buffer gas are generated.

Subsequently, in the process described in the second embodiment, the isolation wall 400 adjacent to the hollow section 202 is broken, whereby the hollow section 200 and the hollow section 202 are connected, so that only the alkali metal gas and the buffer gas can be filled in the hollow section 200 while maintaining the unreacted residue and the alkali metal solid matter when the alkali metal gas is generated in the hollow section 202. Therefore, this can prevent the passage of the laser light for magnetic field measurement from being obstructed by the unreacted residue and the alkali metal solid matter.

Thereafter, according to the method described in the first embodiment, the amount of deformation of the isolation wall 400 isolating the hollow section 201 and whether the isolation wall 400 is damaged or not are measured, where by the pressures of the alkali metal gas and the buffer gas filled in the hollow section 200 can be inspected. More specifically, this can solve, at a time, both of the problem of attachment of the unreacted residue and the alkali metal solid matter, which are generated when the alkali metal gas and the like are generated, to the hollow section 200 where the laser light for magnetic field measurement is passed, and the problem of necessity of a step of easily inspecting the pressure in the hollow section.

FIG. 23 is a schematic cross sectional view illustrating a configuration of a magneto-optical double resonance-type optically pumped magnetometer using the gas cell according to the first to the third embodiments. In the present embodiment, for example, the gas cell described in FIG. 17C-2 according to the second embodiment is used.

The optically pumped magnetometer according to the present embodiment includes the gas cell manufactured using any one of the first to the third embodiments, an optical system including a semiconductor laser 600, an optical fiber 606, a collimating lens 601, a polarizer 602, a wavelength plate 603, a condensing lens 604, and a light detection device 605, and an optical system including a static magnetic field application coil 607 and an RF coil 608.

The laser light emitted by a semiconductor laser 600 is made into parallel light by the collimating lens 601 upon which the laser light is incident via the optical fiber 606, and converted into circular polarization by the polarizer 602 and the wavelength plate 603. The converted laser light is emitted onto the alkali metal gas filled in the hollow section 200 in the gas cell. The static magnetic field generated by the static magnetic field coil 607 is applied to the laser light passing through the gas cell at an angle of 45 degrees. The RF magnetic field generated by the RF coil 608 is applied in a direction perpendicular to the direction in which the static magnetic field is applied. The laser light having passed through the gas cell is condensed by the condensing lens 604, and is detected via the optical fiber 606 by the light detection device 605.

However, the optical fiber 606 may not be used. The laser light may be directly emitted from the semiconductor laser 600 to the collimating lens 601, or the semiconductor laser 600 on the collimating lens 601. Likewise, the light detection device 605 may be arranged on the condensing lens 604. The laser light emitted from the semiconductor laser 600 may be converted into circular polarization. Therefore, as long as the optical system has a configuration for converting the laser light into circular polarization, any one of the semiconductor laser 600, the collimating lens 601, the polarizer 602, the wavelength plate 603, and the optical fiber 606 may be omitted, or the order of the semiconductor laser 600, the collimating lens 601, the polarizer 602, the wavelength plate 603, and the optical fiber 606 may be replaced, or another component may be newly inserted into the semiconductor laser 600, the collimating lens 601, the polarizer 602, the wavelength plate 603, and the optical fiber 606.

The gas cell has such structure that prevents the passage of laser light from being obstructed due to the diffusion of the alkali metal source 300, and therefore, reflection and scattering of the laser light by the alkali metal source 300 can be suppressed. Accordingly, the laser light modulated in the gas cell can be efficiently detected, and therefore, it is possible to obtain an effect of enhancing the detection accuracy of the magnetic field.

Figure 24:
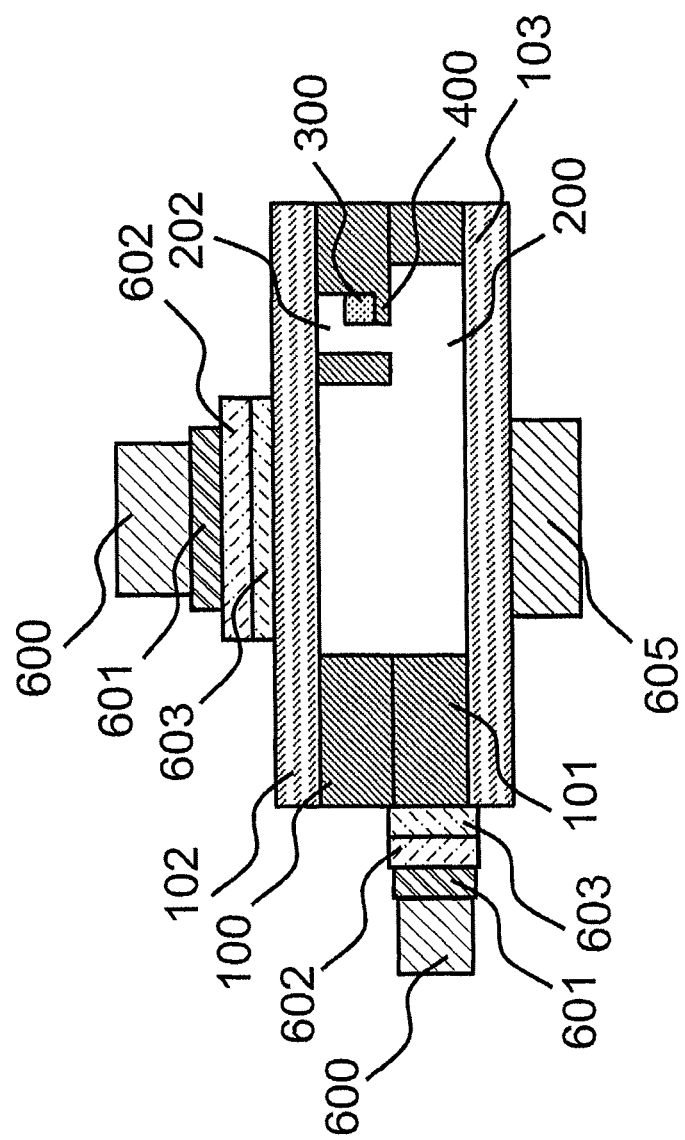
FIG. 24 is a schematic view illustrating the magnetism measuring apparatus according to the third embodiment.

FIG. 24 is a schematic cross sectional view illustrating a configuration of a Faraday rotation-type optically pumped magnetometer using the gas cell according to the first to the third embodiments. In the present embodiment, for example, the gas cell described in FIG. 17C-2 of the second embodiment is used.

The optically pumped magnetometer according to the present embodiment includes the gas cell manufactured using any one of the first to the third embodiments, an optical system including semiconductor lasers 600, collimating lenses 601, polarizers 602, wavelength plates 603, and a light detection device 605, and a magnetic system including a static magnetic field application coil 607. In the optical system, an optical fiber may be inserted just like FIG. 23.

In order to generate pump light that passes in the horizontal direction of FIG. 24 and probe light that passes in the vertical direction of FIG. 24, two sets of the semiconductor lasers 600, the collimating lenses 601, the polarizers 602, and the wavelength plates 603. FIG. 24 indicates that the pump light and the probe light are perpendicular to each other, but the pump light and the probe light may not necessarily be perpendicular to each other as long as the pump light and the probe light are emitted to cross each other in the hollow section 200 filled with the alkali metal gas. However, since the laser light is emitted in the vertical direction and the horizontal direction of FIG. 24, the gas cell made with the transparent material which is transparent to the wavelength band of the laser light is used. For example, glass is used for any one of the process member 100 and the process member 101 or both of the process member 100 and the process member 101. The static magnetic field application coil 607 is arranged to apply the static magnetic field from the closer side to the deeper side in FIG. 24 or from the deeper side to the closer side in FIG. 24, but for the sake of visibility, it is omitted in FIG. 24.

The pump light emitted to the gas cell has circular polarization of a wavelength corresponding to an absorption line of the alkali metal. The pump light is emitted by the semiconductor laser 600 and is made into parallel light by the collimating lens 601, and is converted into circular polarization by the polarizer 602 and the wavelength plate 603. Then, the pump light aligns the direction of the spin of the alkali metal gas filled in the hollow section 200, and forms the spin-polarized state.

In general, the probe light is linear polarization having a wavelength different from the absorption line of the alkali metal. The probe light is emitted by the semiconductor laser 600 and is made into parallel light by the collimating lens 601, and is converted into linear polarization by the polarizer 602 and the wavelength plate 603. When the probe light is incident upon the gas cell filled with the spin-polarized alkali metal gas, the plane of polarized light is rotated due to the Faraday effect. The angle of rotation is proportional to the magnetic field strength in a direction perpendicular to the probe light in the gas cell, and therefore, the magnetic field can be measured by detecting the angle of rotation using the light detection device 605.

As long as the optically pumped magnetometer has a configuration for converting the pump light and the probe light emitted by the semiconductor laser 600 into the above polarization state, any one of the semiconductor laser 600, the collimating lens 601, the polarizer 602, and the wavelength plate 603 may be omitted, or the order of the semiconductor laser 600, the collimating lens 601, the polarizer 602, and the wavelength plate 603 may be replaced, or another component may be newly inserted into the semiconductor laser 600, the collimating lens 601, the polarizer 602, and the wavelength plate 603.

The gas cell has such structure that prevents the passage of laser light from being obstructed due to the diffusion of the alkali metal source 300, and therefore, reflection and scattering of the pump light and the probe light by the alkali metal source 300 can be suppressed. Therefore, the spin-polarized state of the alkali metal gas can be formed efficiently by the pump light, and the angle of rotation of the plane of polarized light of the probe light can be detected efficiently, and it is possible to obtain an effect of enhancing the detection accuracy of the magnetic field.

The invention claimed is:

1. A magnetic field measuring apparatus comprising:
a first sealing member;
a second sealing member; and
a process layer sealed by the first sealing member and the second sealing member,
wherein the process layer includes a first hollow portion in which alkali metal gas is sealed, and a second hollow portion provided opposed to the first hollow portion with a first isolation wall interposed therebetween.

2. The magnetic field measuring apparatus according to claim 1, wherein the process layer has a structure in which a first process member and a second process member are stacked,
the second hollow portion is provided inside of the first process member, and is sealed by the first sealing member, and
the first hollow portion is provided inside of the first process member and inside of the second process member, and is sealed by the first sealing member and the second sealing member.

3. The magnetic field measuring apparatus according to claim 1, wherein the first hollow portion and the second hollow portion are sealed by the first sealing member and the second sealing member.

4. The magnetic field measuring apparatus according to claim 1, wherein the process layer further includes a third hollow portion provided opposed to the first hollow portion with a second isolation wall interposed therebetween, and
a stress that occurs with the second isolation wall when a predetermined pressure is applied is different from that of the first isolation wall.

5. The magnetic field measuring apparatus according to claim 1, wherein the second hollow portion is vacuum-sealed.

6. The magnetic field measuring apparatus according to claim 1, wherein the first sealing member and the second sealing member is made of a material that transmits light in an absorption wavelength band of the alkali metal.

7. The magnetic field measuring apparatus according to claim 6, wherein the material that transmits light in the absorption wavelength band of the alkali metal is glass.

8. The magnetic field measuring apparatus according to claim 1, wherein the process layer is made of a nonmagnetic material.

9. The magnetic field measuring apparatus according to claim 1, wherein the nonmagnetic material is silicon.

10. A method for manufacturing a magnetic field measuring apparatus including a first sealing member, a second sealing member, and a process layer sealed by the first sealing member and the second sealing member, wherein the process layer includes a first hollow portion and a second hollow portion provided with a first isolation wall interposed therebetween, the method comprising:
(a) generating alkali metal gas in the first hollow portion; and
(b) after (a), breaking a portion of the first isolation wall by increasing the stress applied to the first isolation wall caused by the pressure inside of the first hollow portion to a level higher than a destructive limitation stress.

11. The method for manufacturing the magnetic field measuring apparatus according to claim 10,
   wherein in (a), not only the alkali metal gas but also a second gas made of nonmagnetic gas or rare gas are generated, and
   in (b), the stress applied to the first isolation wall caused by the pressure of the first hollow portion is increased to a level higher than a destructive limitation stress, by increasing the pressure of the second gas.

12. A method for manufacturing a magnetic field measuring apparatus including a first sealing member, a second sealing member, and a process layer sealed by the first sealing member and the second sealing member, wherein the process layer has a structure in which the first process member and the second process member are stacked, and a first hollow portion is provided inside of the first process member and inside of the second process member, and a second hollow portion is provided inside of the first process member with a first isolation wall interposed therebetween, the method comprising:

(a) generating alkali metal gas in the second hollow portion; and (b) after (a), breaking a portion of the first isolation wall.

13. The method for manufacturing the magnetic field measuring apparatus according to claim 12, wherein in (b), the first isolation wall is broken by laser light.

14. The method for manufacturing the magnetic field measuring apparatus according to claim 12, wherein in (b), the stress applied to the first isolation wall caused by the pressure inside of the first hollow portion is increased to a level higher than a destructive limitation stress, thus breaking the first isolation wall.

15. The method for manufacturing the magnetic field measuring apparatus according to claim 12, wherein in (a), not only the alkali metal gas but also a second gas made of nonmagnetic gas or rare gas are generated.

* * * * *